(12) United States Patent
Chu et al.

(10) Patent No.: US 7,579,123 B2
(45) Date of Patent: Aug. 25, 2009

(54) METHOD FOR CRYSTALLIZING AMORPHOUS SILICON INTO POLYSILICON AND MASK USED THEREFOR

(75) Inventors: Fang-Tsun Chu, Taichung County (TW); Yu-Cheng Chen, Taipei County (TW)

(73) Assignee: Industrial Technology Research Institute, Hsinchu (TW)

( * ) Notice: Subject to any disclaimer, the term of this patent is extended or adjusted under 35 U.S.C. 154(b) by 496 days.

(21) Appl. No.: 11/557,947

(22) Filed: Nov. 8, 2006

(65) Prior Publication Data

US 2007/0196743 A1 Aug. 23, 2007

(30) Foreign Application Priority Data

Feb. 17, 2006 (TW) .............................. 95105364 A

(51) Int. Cl.
*G03F 1/00* (2006.01)
(52) U.S. Cl. .......................................................... 430/5
(58) Field of Classification Search ................. 430/5, 430/311, 394; 117/107, 108
See application file for complete search history.

(56) References Cited

U.S. PATENT DOCUMENTS 6,800,540 B1 10/2004 You

*Primary Examiner*—Stephen Rosasco
(74) *Attorney, Agent, or Firm*—Jianq Chyun IP Office

(57) ABSTRACT

A mask for laser-crystallizing amorphous silicon into polysilicon is provided. The mask comprises a transparent substrate having a first block, a second block, and a third block with equal sizes. The second block is located between the first block and the third block. The first block includes a plurality of first transmission regions and a plurality of first opaque regions located between the first transmission regions. The second block includes a plurality of second transmission regions correspond to the first opaque regions and a plurality of second opaque regions located between the second transmission regions and corresponds to the first transmission regions. The third block includes a plurality of third transmission regions arranged corresponding to the centers of the first transmission regions and corresponding to centers of the second transmission regions and a plurality of third opaque regions located between the third transmission regions.

36 Claims, 27 Drawing Sheets

METHOD FOR CRYSTALLIZING AMORPHOUS SILICON INTO POLYSILICON AND MASK USED THEREFOR

CROSS-REFERENCE TO RELATED APPLICATION

This application claims the priority benefit of Taiwan application serial no. 95105364, filed Feb. 17, 2006. All disclosure of the Taiwan application is incorporated herein by reference.

BACKGROUND OF THE INVENTION

1. Field of Invention

The present invention relates to a method and a mask for crystallizing semiconductor material, and more particularly to a method for crystallizing amorphous silicon into polysilicon (poly-Si) and a mask used therefor.

2. Description of Related Art

In recent years, to meet the requirements of the high-performance flat-panel display and the integrated circuits for the panel, the low-temperature poly-Si thin-film crystallization technology has been widely researched. Excimer laser crystallization has become the mainstream of current crystallization technology.

The sequential lateral solidification (SLS) crystallization technique is a modified of the excimer laser crystallization technique. The original excimer laser system is further provided with a substrate platform in a submicron movement and a high-precision optical system, and the laser beams are modulated by the mask design in the optical system, for controlling the film lateral solidification, crystallization region, and the positions of the grain boundary. Thus, a polysilicon film with a periodical grain boundary arrangement is obtained. Therefore, the grain size and the film crystallization quality obtained by the SLS crystallization technique are closely related to the modulated mask design in the optical system.

With a proper mask design, the SLS laser crystallization device can be used to prepare a low-temperature polysilicon thin-film transistor device with high carrier mobility. The size of the obtained polysilicon grain can be larger than that of the grain obtained by the conventional excimer laser crystallization technique, and has a preferred uniformity. Therefore, the SLS crystallization technique is regarded as a promising crystallization technique for the next generation. However, although a polysilicon film with larger grains can be obtained through the SLS crystallization technique, high surface roughness and thin-film protrusion with defects are still observed in the SLS crystallized poly-Si thin-films.

FIGS. 1A to 1D are schematic views for an actual grain growth. A mask is disposed above the substrate 10, and then laser irradiation is conducted, such that the regions irradiated by the laser in the amorphous silicon film on the substrate 10 are melted into a liquid phase silicon film 11. Then, as shown FIG. 1A, the solid amorphous silicon film without being irradiated by the laser induces the liquid phase silicon film 11 to laterally solidify into polysilicon 14, as shown in FIGS. 1B to 1D, until the poly-Si grains at the two sides touch each other, as shown in FIG. 1E. Through the above crystallization method, large-sized grains with periodical arrangements can be fabricated. However, as shown in FIG. 1E, an obvious film protrusion 16 occurs at the region where the grains touch each other, after lateral grain growth. These film protrusions cause device electrical characteristics and reliability degradations.

SUMMARY OF THE INVENTION

In view of the above, the present invention provides several masks to relieve the film protrusion phenomenon caused by laser crystallization and to provide the obtained polysilicon film with a relatively flat surface, thereby solving the electrical characteristics, reliability, and uniformity related issues of the device.

The present invention further provides several methods for crystallizing an amorphous silicon layer to polysilicon layer. These methods can relieve the film protrusion phenomenon caused by laser crystallization, and provide the obtained polysilicon film with a relatively flat surface, thereby solving the electrical characteristics, reliability, and uniformity related issues of the device.

The present invention provides a mask used for laser-crystallizing amorphous silicon into polysilicon. The mask includes a transparent substrate having a first block, a second block, and a third block of equal sizes. The second block is located between the first block and the third block. The first block includes a plurality of first transmission regions and a plurality of first opaque regions, wherein the first opaque regions are located between the first transmission regions. The second block includes a plurality of second transmission regions and a plurality of second opaque regions, wherein the second opaque regions are located between the second transmission regions; the second opaque regions correspond to the first transmission regions; and the second transmission regions correspond to the first opaque regions. The third block includes a plurality of third transmission regions and a plurality of third opaque regions, wherein the third transmission regions are arranged corresponding to the centers of the first transmission regions and corresponding to the centers of the second transmission regions; and the third opaque regions are located between the third transmission regions.

According to an embodiment of the present invention, the transparent substrate further includes a fourth block. The fourth block is adjacent to one side of the first block that is not adjacent to the second block, and the size of the fourth block is the same as that of the first, second, and third blocks. The fourth block includes a plurality of fourth transmission regions and a plurality of fourth opaque regions, wherein the fourth transmission regions are arranged corresponding to the centers of the first transmission regions and corresponding to the centers of the second transmission regions; and the fourth opaque regions are located between the fourth transmission regions.

According to the embodiment of the present invention, the width of the first transmission regions is larger than that of the second opaque regions. The width of the second opaque regions is larger than that of the third transmission regions and that of the fourth transmission regions. The width of the second transmission regions is larger than that of the first opaque regions. The width of the first opaque regions is larger than that of the third transmission regions and that of the fourth transmission regions.

The present invention provides a method for crystallizing an amorphous silicon layer. First, a laser is used to irradiate through the first transmission regions of a mask, so as to form a plurality of first crystalline regions in the amorphous silicon layer, wherein each of the first crystalline regions has a first protrusion region. Next, the laser is used to irradiate through the second transmission regions of the mask, such that a plurality of second crystalline regions is formed on the non-crystalline regions between the first crystalline regions, wherein each second crystalline region has a second protrusion region. Then, the laser is used to irradiate through the third transmission regions of the mask, such that the first protrusion regions and the second protrusion regions are flattened.

According to the embodiment of the present invention, the width of the third transmission regions is less than that of the first transmission regions, and less than that of the second transmission regions.

The present invention further provides a method for crystallizing an amorphous silicon layer. First, a laser is used to irradiate through the first transmission regions of the mask, so as to form a plurality of odd-numbered first irradiated regions and a plurality of even-numbered first irradiated regions in the amorphous silicon layer. Next, a laser is used to irradiate through the second transmission regions of the mask, such that a plurality of first crystalline regions is formed on the odd-numbered/even-numbered first irradiated regions and the amorphous silicon layer there-around, wherein each first crystalline region has a first protrusion region. Then, a laser is used to irradiate through the third transmission regions of the mask, such that a plurality of second crystalline regions is formed in the non-crystalline regions between the first crystalline regions, and the even-numbered/odd-numbered first irradiated regions, wherein each second crystalline region has a second protrusion region. Then, a laser is used to irradiate through the fourth transmission regions of the mask, such that the first protrusion regions and the second protrusion regions are flattened.

According to the embodiment of the present invention, the widths of the third and fourth transmission regions are less than that of the first transmission regions, and less than that of the second transmission regions.

The present invention provides a mask. The mask includes a transparent substrate, and the transparent substrate is divided into a first block, a second block, a third block, and a fourth block, which are sequentially adjacent to each other and have the same size. The first block includes a plurality of first transmission regions and a plurality of first opaque regions, wherein the first opaque regions are located between the first transmission regions. The second block includes a plurality of second transmission regions, a plurality of third transmission regions, and a plurality of second opaque regions, wherein each of the second transmission regions is located between two adjacent third transmission regions; the second opaque regions are located between the adjacent second transmission region and third transmission region; the second transmission regions are arranged, such that the positions of the first transmission regions are substantially at the centers of the second transmission regions; and the third transmission regions are arranged corresponding to the first opaque regions. The third block includes a plurality of fourth transmission regions, a plurality of fifth transmission regions, and a plurality of third opaque regions, wherein each of the fourth transmission regions is located between two adjacent fifth transmission regions; the third opaque regions are located between the adjacent fourth transmission regions and fifth transmission region; the fourth transmission regions are arranged, such that the positions of the third transmission regions are substantially at the centers of the fourth transmission regions; and the fifth transmission regions are arranged corresponding to the centers of the second transmission regions. The fourth block includes a plurality of sixth transmission regions and a plurality of fourth opaque regions, wherein the sixth transmission regions are arranged corresponding to the centers of the fourth transmission regions; and the fourth opaque regions are located between the sixth transmission regions.

According to the embodiment of the present invention, the width of the second transmission regions is larger than that of the first transmission regions, and larger than that of the fifth transmission regions. The width of the fourth transmission regions is larger than that of the third transmission regions, and larger than that of the sixth transmission regions.

The present invention provides a method for crystallizing an amorphous silicon layer. First, a laser is used to irradiate through the first transmission regions of a mask, so as to form a plurality of first irradiated regions in the amorphous silicon layer. Next, the laser is used to irradiate through the second and third transmission regions of the mask, such that a plurality of first crystalline regions is formed in the first irradiated regions and the amorphous silicon layer there-around, and a plurality of second irradiated regions is formed in the amorphous silicon layer between the first irradiated regions, wherein each first crystalline region has a first protrusion region. Then, a laser is used to irradiate through the fourth and fifth transmission regions of the mask, such that a plurality of second crystalline regions is formed on the non-crystalline regions between the first crystalline regions, and the second irradiated regions, and the first protrusion regions are flattened, wherein each second crystalline region has a second protrusion region. Then, the above-mentioned laser is used to irradiate through the sixth transmission regions of the mask, such that the second protrusion regions are flattened.

According to the embodiment of the present invention, the width of the second transmission regions is larger than that of the first transmission regions, and larger than that of the fifth transmission regions. The width of the fourth transmission regions is larger than that of the third transmission regions, and larger than that of the sixth transmission regions.

The present invention provides a method for crystallizing amorphous silicon, which includes providing a substrate. The substrate has already been formed with an amorphous silicon layer thereon, and the substrate can be divided into several rows, and each row can be divided into a plurality of regions. Next, a mask is aligned and disposed above the first to fourth regions at the first row of the substrate, wherein the mask includes at least four adjacent blocks of the same size. Then, a laser passes through a plurality of transmission regions of the blocks of the mask, and the substrate and/or the mask is moved, such that the relative position between the mask and the substrate is shifted by a distance of one block along a first direction, and thereby the laser passes through the transmission regions. This step is repeated, such that a first crystalline region is formed on each region in the first row of the substrate being aligned with the mask has a laser passing there-through, and thereby, the protrusion region in the first crystalline region is flattened. Then, the substrate and/or the mask are moved such that the mask is aligned with the last four regions in the second row of the substrate, and then, the laser passes through the transmission regions of the blocks of the mask. Then, the substrate and/or the mask are moved, such that a relative position between the mask and the substrate is shifted by a distance of one block along a direction opposite to the first direction, and the laser passes through the transmission regions. This step is repeated, such that a second crystalline region is formed on each region in the second row of the substrate being aligned with the mask has a laser passing there-through, and thereby, the protrusion region in the second crystalline region is flattened. The above steps are repeated, such that a crystalline region is formed on each region in each row of the substrate, and the protrusion regions in the first crystalline regions are flattened.

The present invention provides a method for crystallizing amorphous silicon. First, a first mask is aligned and disposed above the substrate already formed with an amorphous silicon layer thereon. The first mask includes a first block and a second block, which are adjacent to each other and have the same size. The first block includes a plurality of first transmission regions and a plurality of first opaque regions, wherein the first opaque regions are located between the first transmission regions. The second block includes a plurality of second transmission regions and a plurality of second opaque regions, wherein the second opaque regions are located between the second transmission regions; the second opaque regions are arranged corresponding to the centers of the first transmission regions; and the second transmission regions are arranged, such that the positions of the first opaque regions are substantially at the centers of the second transmission regions. Then, a laser passes through the first transmission regions of the first block with the first mask as a mask, so as to form a plurality of first crystalline regions in the amorphous silicon layer, wherein each first crystalline region has a first protrusion region. Then, the substrate and/or the first mask are moved by a distance, such that the second block of the first mask is shifted to a position above the substrate where the first block had previously been located, and the laser passes through the second transmission regions of the second block, such that a plurality of second crystalline regions is formed on the plurality of non-crystalline regions between the first crystalline regions, wherein each second crystalline region has a second protrusion region. Then, the first mask is removed, and a second mask is disposed above the substrate. The second mask includes a plurality of third transmission regions and a plurality of third opaque regions, wherein the third opaque regions are located between the third transmission regions; the third transmission regions are corresponding to the centers of the first transmission regions and corresponding to the centers of the second transmission regions. Then, the third transmission regions of the second mask are aligned with the first protrusion regions and the second protrusion regions, and the laser passes through the third transmission region, such that the first protrusion regions and the second protrusion regions are flattened.

According to the embodiment of the present invention, the substrate is disposed on a base, and is moved via the base. The moving distance of the base is about half of the length of the first mask. Moreover, the width of the first transmission regions is larger than that of the second opaque regions, and the width of the second transmission regions is larger than that of the first opaque regions. In addition, the widths of the first transmission regions and that of the second transmission regions are larger than that of the third transmission regions.

The present invention further provides a method for crystallizing amorphous silicon, which includes the following steps. First, in Step A, a substrate is provided, wherein the substrate has already been formed with an amorphous silicon layer thereon; the substrate can be divided into several rows, and each row includes a first region, a second region, etc. . . . up to an $n^{th}$ region, which are adjacent sequentially. Next, in Step B, a first mask is aligned and disposed above the substrate, wherein the first mask includes a first block and a second block, which are adjacent to each other and have the same size. The first block includes a plurality of first transmission regions and a plurality of first opaque regions, wherein the first opaque regions are located between the first transmission regions, and the width of the first opaque regions is less than that of the first transmission regions. The second block includes a plurality of second transmission regions and a plurality of second opaque regions, wherein the second opaque regions are located between the first transmission regions; the second opaque regions are arranged corresponding to the centers of the first transmission regions; and the second transmission regions are arranged such that the positions of the first opaque regions are substantially located at the centers of the second transmission regions. Then, in Step C, the laser passes through the first transmission regions and the second transmission regions with the first mask as a mask, so as to form a plurality of first crystalline regions on the first region and the second region in the first row of the substrate, wherein each first crystalline region has a protrusion region respectively. Then, in Step D, the substrate and/or the first mask are moved for a first distance, such that the second block of the first mask is shifted to a position above the second region in the first row of the substrate where the first block had previously been located, and a laser passes through the first and second transmission regions. With the laser passing through the second transmission region, a plurality of second crystalline regions is formed on a plurality of non-crystalline regions between the first crystalline regions of the second region of the substrate. With the laser passing through the first transmission region, a plurality of first crystalline regions is formed on the third region of the substrate. Each first crystalline region of the third region and each second crystalline region of the second region have a protrusion region respectively. Then, the step of moving the substrate and/or the first mask for a first distance and passing the laser are repeated, such that a plurality of first crystalline regions and a plurality of second crystalline regions is formed on each region in the first row of the substrate. Then, in Step F, the first mask is removed. Then, in Step G, a second mask is disposed above the substrate, wherein the length of the third block of the second mask is twice of that of the first block and that of the second block. The third block includes a plurality of third transmission regions and a plurality of third opaque regions, wherein the third opaque regions are located between the third transmission regions, and the third transmission regions are corresponding to the centers of the first transmission regions and corresponding to the centers of the second transmission regions. Then, in Step H, the third transmission regions of the second mask are aligned with the protrusion regions of the first crystalline regions and the second crystalline regions of the first region and the second region in the first row of the substrate, and the laser passes through the third transmission regions, such that the protrusion regions of the first region and the second region are flattened. Then, in Step I, the substrate and/or the second mask are moved for a second distance such that the second mask corresponds to the third region and the fourth region in the first row of the substrate, and the laser passes through the third transmission regions, such that the protrusion regions of the third region and the fourth region are flattened. Then, in Step J, the step of moving the substrate and/or the second mask for a second distance and passing the laser are repeated, such that the protrusion regions of each region in the first row of the substrate are flattened.

According the embodiment of the present invention, the substrate is disposed on a base, and is moved via the base. The moving distance of the base is about half of the length of the first mask.

According to the embodiment of the present invention, the width of the first transmission regions is larger than that of the second opaque regions; the width of the second transmission regions is larger than that of the first opaque regions; and the widths of the first transmission regions and that of the second transmission regions are larger than that of the third transmission regions.

According to the embodiment of the present invention, after Step E and before Step F, it further includes repeating the above steps of Steps C to D, such that a plurality of first crystalline regions and a plurality of second crystalline regions are formed in each region in each row of the substrate. After Step J, it further includes repeating the above steps of Steps I to J, such that the protrusion regions of the first crystalline regions and the second crystalline regions of each region in each row of the substrate are flattened.

According to another embodiment of the present invention, after Step E and before Step F, it further includes forming a plurality of first crystalline regions on the $(n-1)^{th}$ region and the $n^{th}$ region in the second row of the substrate according to the above method. Then, a plurality of second crystalline regions are formed on the plurality of non-crystalline regions between the first crystalline regions of the $(n-1)^{th}$ region, and meanwhile, a plurality of first crystalline regions are formed on the $(n-2)^{th}$ region of the substrate. The aforementioned steps are repeated, such that a plurality of first crystalline regions and a plurality of second crystalline regions are formed on each region in the second row of the substrate. With the method for forming the first crystalline regions and the second crystalline regions on each region in the first row of the substrate, a plurality of first crystalline regions and a plurality of second crystalline regions are formed on each region in the odd-numbered rows of the substrate. With the method for forming the first crystalline regions and the second crystalline regions on each region in the second row of the substrate, a plurality of first crystalline regions and a plurality of second crystalline regions are formed on each region in the even-numbered rows of the substrate.

According to the embodiment of the present invention, after Step J, it further includes repeating the above steps of Steps I to J, such that the protrusion regions of each region in each row of the substrate are flattened. Alternatively, after Step J, it further includes enabling the laser to pass through the third transmission region, such that the protrusion regions of the $(n-1)^{th}$ region and the $n^{th}$ region are flattened. Then, the laser is made to pass through the third transmission regions, such that the protrusion regions of the $(n-3)^{th}$ region and the $(n-2)^{th}$ region are flattened. The protrusion regions of each region in the second row of the substrate sequentially are flattened. With the above method for flattening the protrusion regions of each region in the first row and each region in the second row of the substrate, the protrusion regions of each region in the odd-numbered and even-numbered rows of the substrate are flattened.

The present invention further provides a method for crystallizing an amorphous silicon layer. First, a laser is used to irradiate through the first transmission regions of a first mask, so as to form a plurality of first crystalline regions in the amorphous silicon layer, wherein each first crystalline region has a first protrusion region. Then, the laser is used to irradiate through the second transmission regions of the first mask, such that a plurality of second crystalline regions is formed on the non-crystalline regions between the first crystalline regions, wherein each second crystalline region has a second protrusion region. Then, the laser is used to irradiate through the third transmission regions of a second mask, such that the first protrusion regions and the second protrusion regions are flattened.

According to the embodiment of the present invention, the width of the third transmission regions is larger than that of the first transmission regions, and larger than that of the second transmission regions.

The mask of the present invention can be used to solve the film protrusion problem caused by laser crystallization, thereby improving the electrical characteristics and reliability of the transistor. On the other hand, the mask of the present invention can be applied in the bidirectional SLS crystallization. Compared with the conventional mask design only applicable for a unidirectional SLS, the new mask provided in the present invention is appropriate for mass production.

In order to make aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

First Embodiment

Figure 1A:
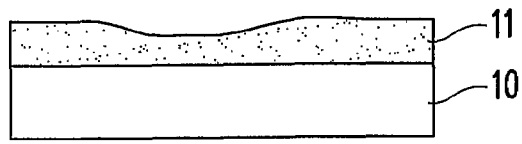
FIGS. 1A to 1E are schematic views of a grain growth in a conventional amorphous silicon crystallization.
Figure 1B:
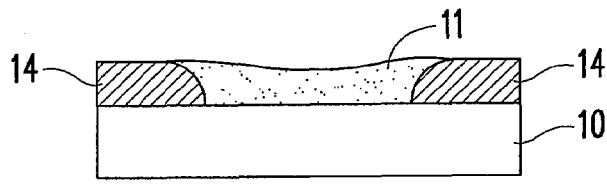
Figure 1C:
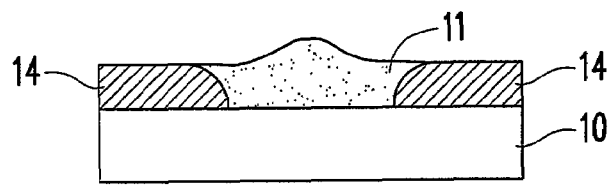
Figure 1D:
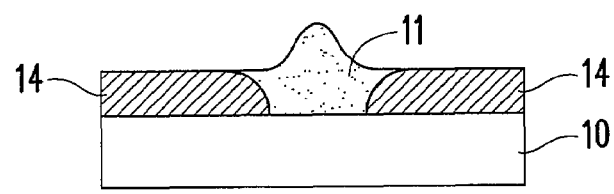
Figure 1E:
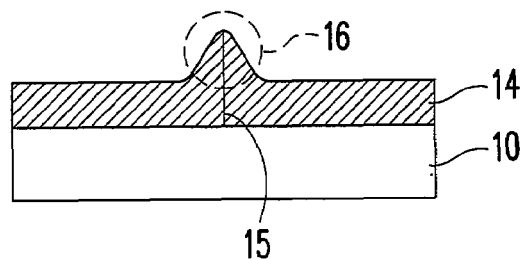
Figure 2:
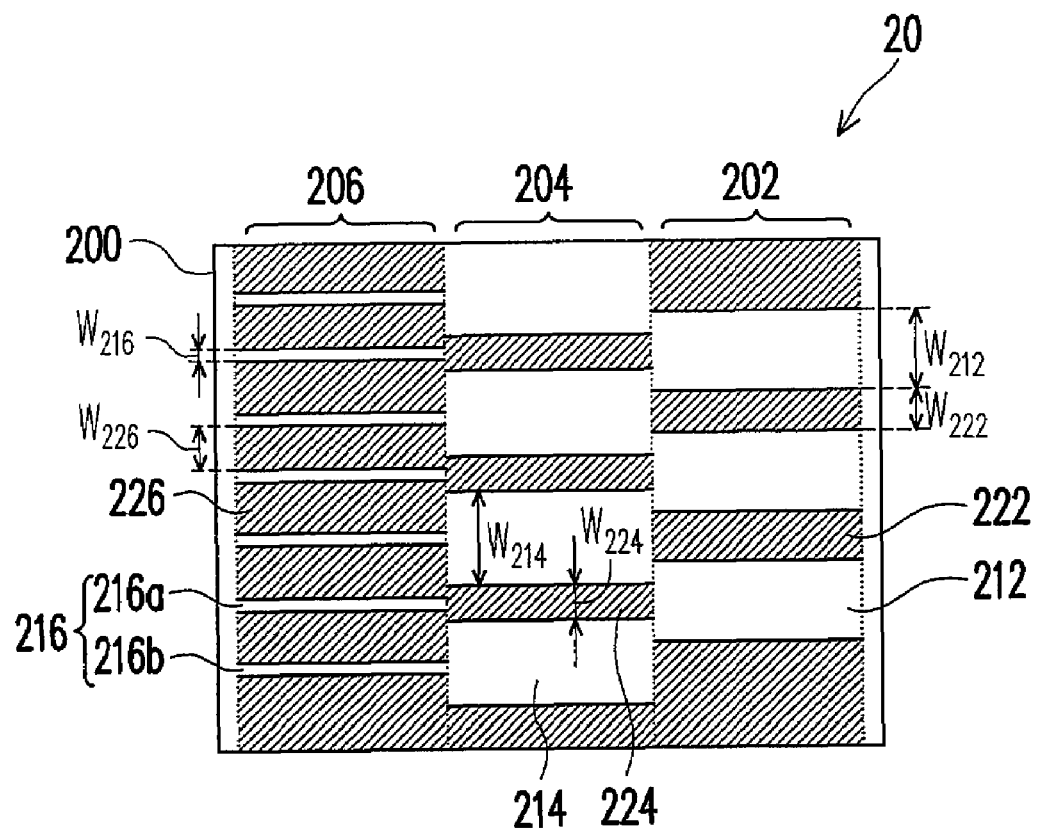
FIG. 2 is a schematic view of a mask used for crystallizing amorphous silicon according to a first embodiment of the present invention.

A first mask of the present invention is as shown in FIG. 2. Referring to FIG. 2, the mask 20 includes a transparent substrate 200. The transparent substrate 200 is, for example, glass or quartz, and includes three blocks 202, 204, 206 of the same size. The second block 204 is located between the first block 202 and the third block 206. These blocks 202, 204 and 206 include transmission regions 212, 214, and 216, and opaque regions 222, 224, and 226 respectively, wherein the opaque regions 222, 224, and 226 are located between the transmission regions 212, the transmission regions 214, and the transmission regions 216 respectively. The first transmission regions 212 of the first block 202 are arranged corresponding to the second opaque regions 224, and the width $W_{212}$ of the first transmission regions 212 is larger than the width $W_{224}$ of the second opaque regions 224. The second transmission regions 214 of the second block 204 are arranged corresponding to the first opaque regions 222, and the width $W_{214}$ of the second transmission regions 214 is larger than the width $W_{222}$ of the first opaque regions 222. In an embodiment, the width $W_{212}$ of the first transmission regions 212 and the width $W_{214}$ of the second transmission regions 214 are determined in such a way that the width of the crystalline region formed in the amorphous silicon is no larger than twice the length of the maximum grain growth after the amorphous silicon is directly irradiated by a laser or passes through a laser optical system. A part of the third block 206, the third transmission region 216a, is arranged corresponding to the centers of the first transmission regions 212, and the other part 216b is arranged corresponding to the centers of the second transmission regions 214. The width $W_{216}$ of the third transmission regions 216b is less than the width $W_{224}$ of the opaque regions 224. The width $W_{216}$ of the third transmission regions 216a is less than the width $W_{222}$ of the opaque regions 222. In an embodiment, the width $W_{216}$ of the third transmission regions 216 is determined in such a way that the protrusion regions in the crystalline region formed on the substrate 200 are flattened after the substrate 200 is irradiated by a laser through the first transmission regions 212 and the second transmission regions 214, wherein the laser is used for direct irradiation or passes through a laser optical system.

Figure 3A:
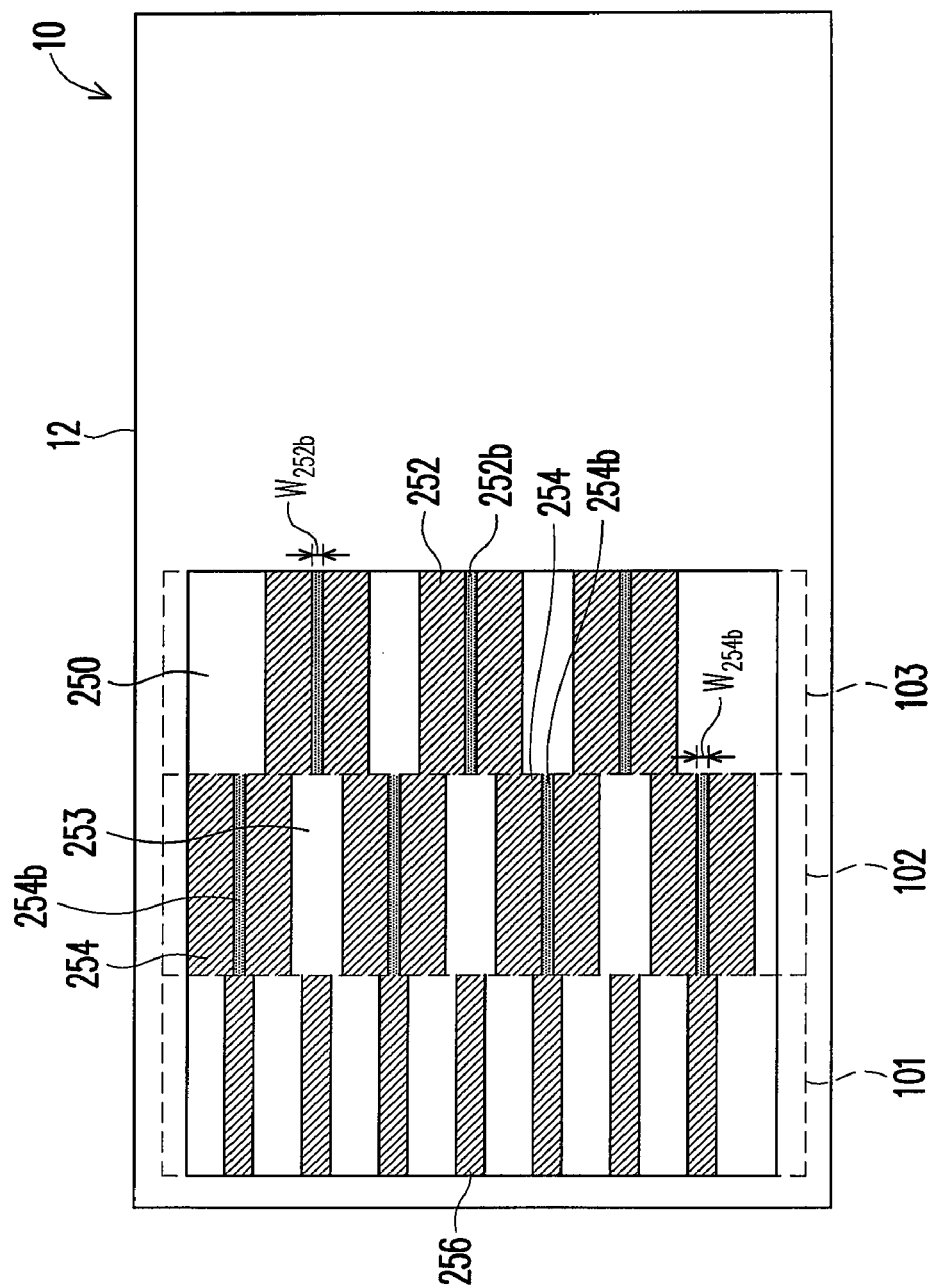
FIGS. 3A to 3C are cross-sectional views of a flow for crystallizing amorphous silicon according to the first embodiment of the present invention.

Referring to FIG. 3A, when the mask 20 is used for crystallizing an amorphous silicon layer, the block 202 of the mask 20 corresponds to the region 103 of the substrate 10; the block 204 corresponds to the region 102 of the substrate 10; and the block 206 corresponds to the region 101 of the substrate 10. With the laser passing through the first transmission regions 212, the amorphous silicon layer on the region 103 of the substrate 10 is melted and then solidified to be crystallized into polysilicon, forming a plurality of crystalline regions 252, wherein each of the crystalline regions 252 has a protrusion region 252b. With the laser passing through the second transmission regions 214, the amorphous silicon layer on the region 102 of the substrate 10 is crystallized into polysilicon, forming a plurality of crystalline regions 254, wherein each of the crystalline regions 254 has a protrusion region 254b. With the laser passing through the third transmission regions 216, the amorphous silicon layer on the region 101 of the substrate 10 is crystallized into polysilicon, forming a plurality of crystalline regions 256. As the width $W_{216}$ of the third transmission regions 216 is relatively small, the formed crystalline regions 256 are different from the above crystalline regions 252 and are referred as irradiated regions 256, in order to distinguish them.

Figure 3B:
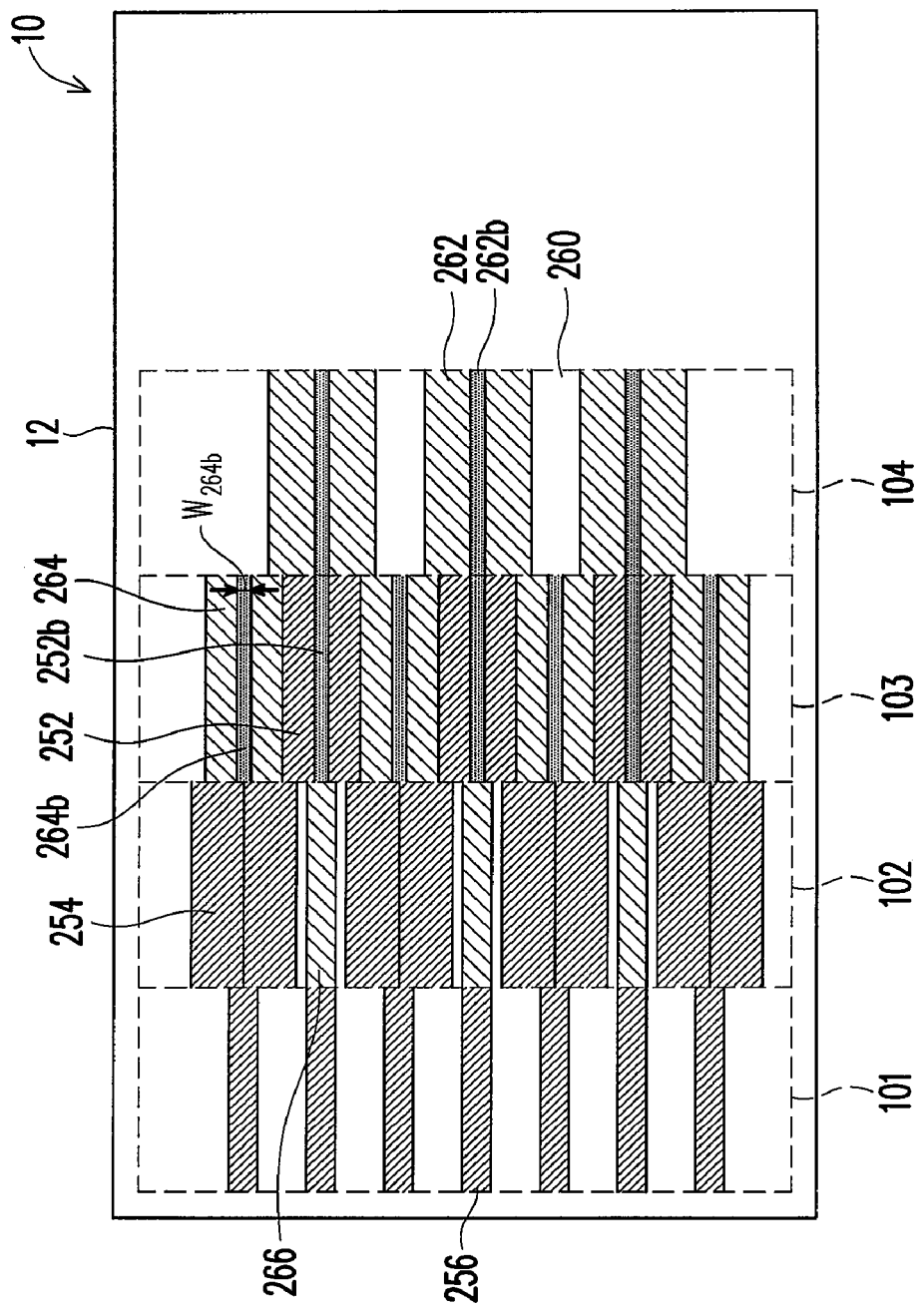

Then, referring to FIG. 3B, the mask 20 and/or the substrate 10 are moved by a distance, such that the first block 202 of the mask 20 is correspondingly located above the region 104 of the substrate 10; the second block 204 is correspondingly located above the region 103 of the substrate 10; and the third block 206 is corresponding located above the region 102 of the substrate 10. With the laser passing through the first transmission regions 212, the amorphous silicon layer on the region 104 is crystallized into polysilicon, forming a plurality of crystalline regions 262, wherein each of the crystalline regions 262 has a protrusion region 262b. With the laser passing through the second transmission regions 214, crystalline regions 264 are formed on the non-crystalline regions 250 between the crystalline regions 252 of the region 103, wherein each of the crystalline regions 264 has a protrusion region 264b. Since the width $W_{216}$ of the third transmission regions 216 is large enough, the laser passing through the third transmission regions 216 enables the protrusion regions 254b of the region 102 to be melted and then solidified, and thereby the formed boundary becomes relatively flat, wherein the laser is used for the direct irradiation or passes through a laser optical system. With the laser passing through the third transmission regions 216, irradiated regions 266 are formed on a part of non-crystalline regions 253 between the crystalline regions 252.

Figure 3C:
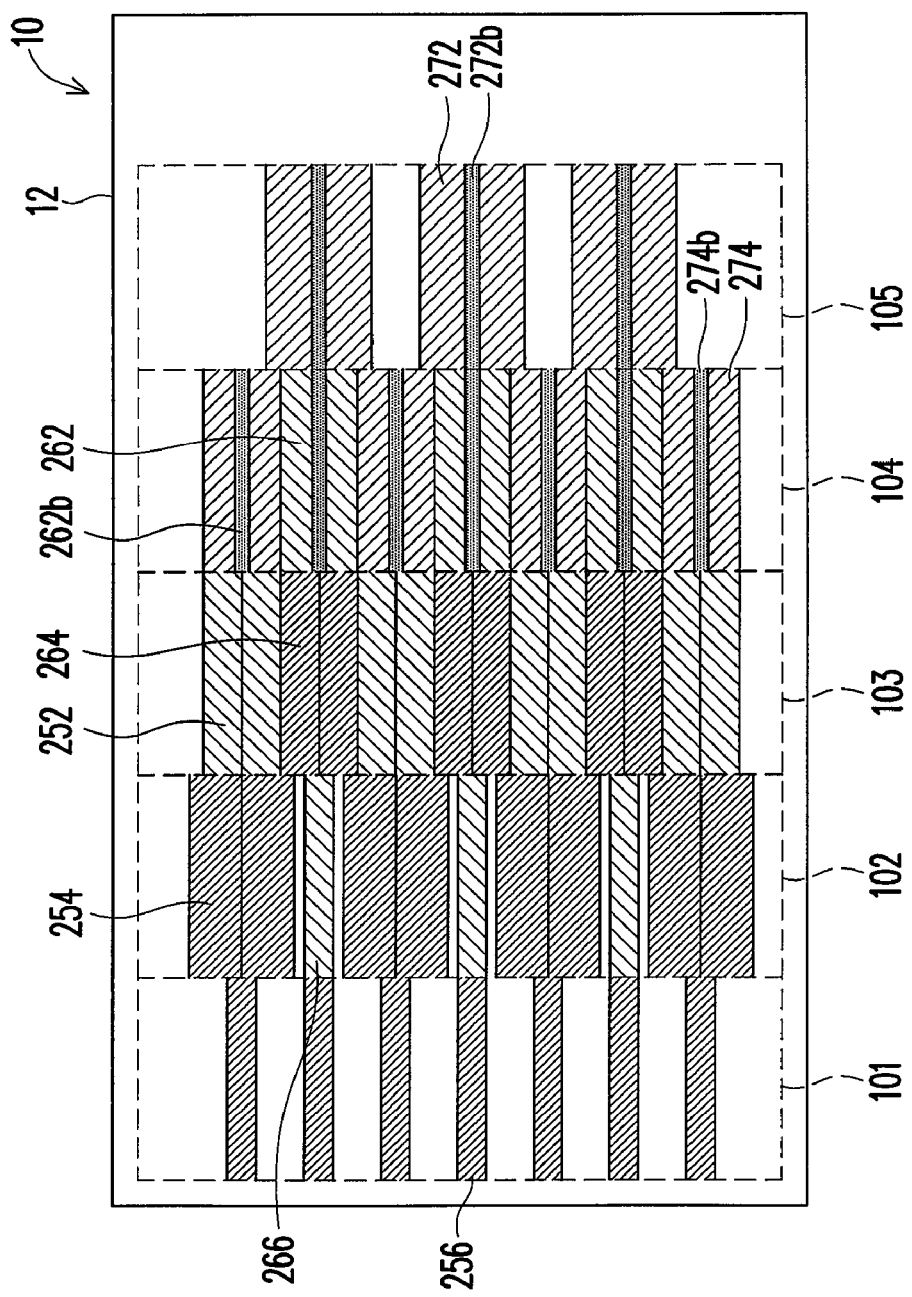

Then, referring to FIG. 3C, the mask 20 and/or the substrate 10 are moved by a distance, such that the first block 202 of the mask 20 is correspondingly located above the region 105 of the substrate 10; the second block 204 is correspondingly located above the region 104 of the substrate 10; and the third block 206 is correspondingly located above the region 103 of the substrate 10. With the laser passing through the first transmission regions 212, the amorphous silicon layer on the region 105 is crystallized into polysilicon, forming a plurality of crystalline regions 272, wherein each of the crystalline regions 272 has a protrusion region 272b. With the laser passing through the second transmission regions 214, crystalline regions 274 are formed on the non-crystalline regions 260 between the crystalline regions 262 of the region 104, wherein each of the crystalline regions 274 has a protrusion region 274b. With the laser passing through the third transmission regions 216, the width $W_{216}$ of the third transmission regions 216 is large enough that the laser passing therethrough enables the protrusion regions 252b to be flattened.

Then, the above steps are repeated, such that the amorphous silicon layer on the substrate 10 is crystallized into polysilicon, and the boundaries formed are very flat.

Second Embodiment

Figure 4:
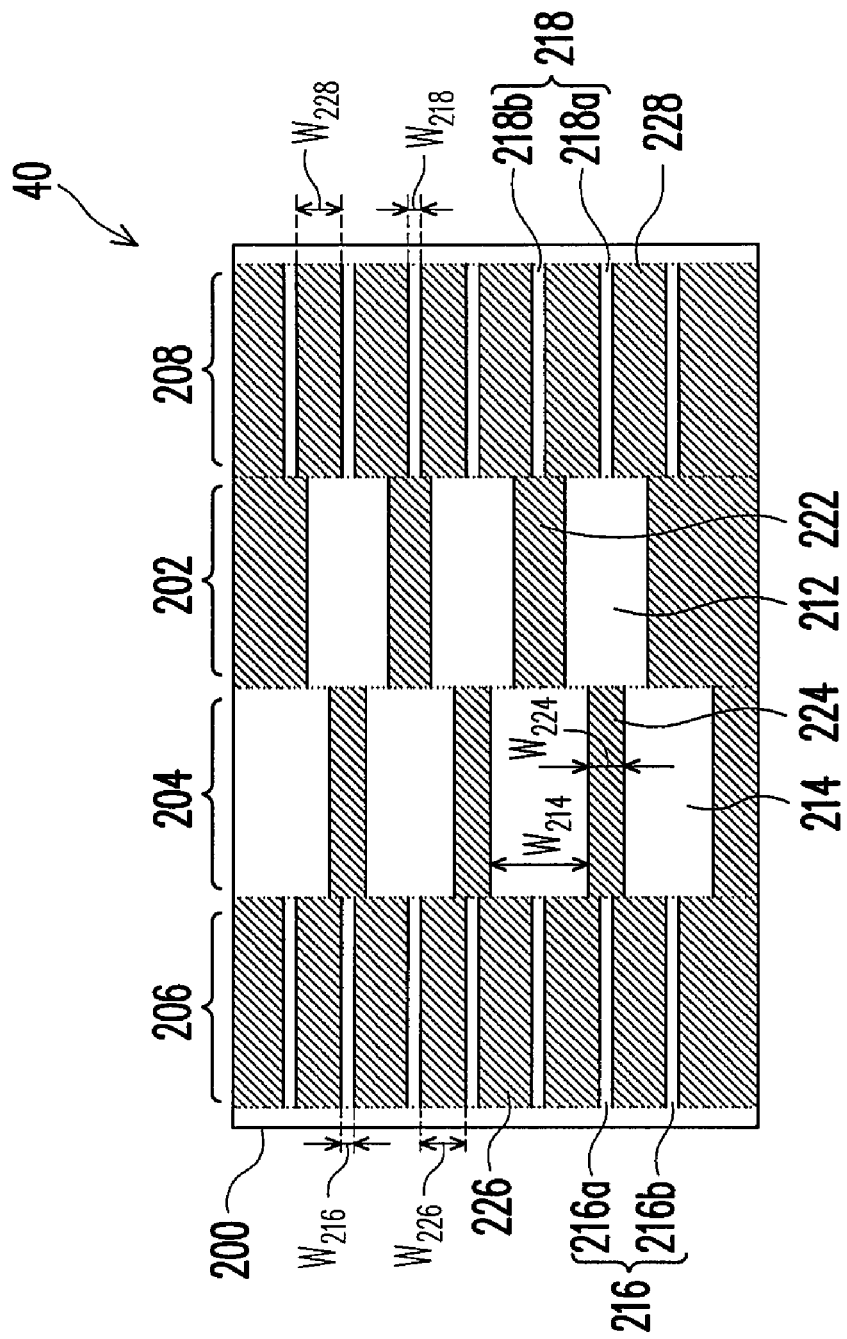
FIG. 4 is a schematic view of a mask used for crystallizing amorphous silicon according to a second embodiment of the present invention.

Referring to FIG. 4, the present invention further provides another mask 40. The structure of the mask 40 is similar to that of the mask 30. But at the other side of the first block 202, a fourth blocks 208 is further included. That is, the substrate 20 includes four blocks 208, 202, 204, and 206 of the same size. The fourth block 208 includes transmission regions 218 and opaque regions 228 located between the transmission regions 218. One part 218a of the fourth transmission region 218 of the fourth block 208 is arranged corresponding to the centers of the first transmission regions 212, and the other part 218b are arranged corresponding to the centers of the second transmission regions 214. The width $W_{218}$ of the fourth transmission regions 218b is less than the width $W_{224}$ of the opaque regions 224. The width $W_{218}$ of the fourth transmission regions 218a is less than the width $W_{222}$ of the opaque regions 222. In an embodiment, the width of the fourth transmission regions 218 is determined to be large enough that the protrusion regions in the crystalline regions on the substrate 200 are flattened after being irradiated by a laser passing through the first transmission regions 216 and the second transmission regions 214, wherein the laser is used for the direct irradiation or passes through a laser optical system. The width $W_{218}$ of the fourth transmission regions 218 can be same as or different from the width $W_{216}$ of the third transmission regions 216.

Figure 4A:
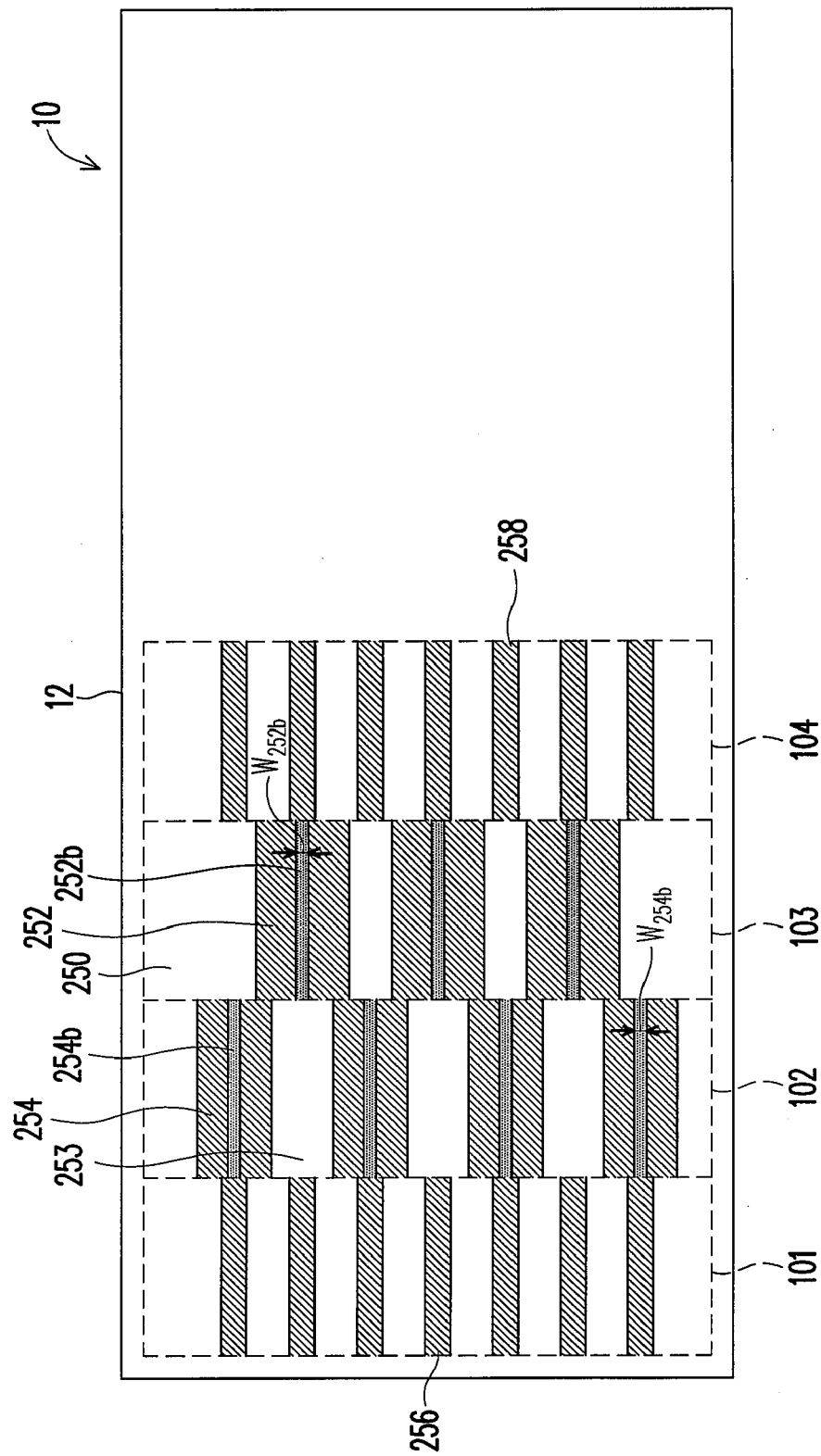
FIGS. 4A to 4EE are cross-sectional views of a flow for crystallizing amorphous silicon according to the second embodiment of the present invention.

Referring to FIG. 4A, when the above mask 40 is used for crystallizing an amorphous silicon layer, the block 208 of the mask 40 corresponds to the region 104 of the substrate 10; the block 202 corresponds to the region 103 of the substrate 10; the block 204 corresponds to the region 102 of the substrate 10; and the block 206 corresponds to the region 101 of the substrate 10. The crystallization of the amorphous silicon layer on the regions 101 to 103 of the substrate 10 after being irradiated by the laser is shown in FIG. 3A. With the laser passing through the fourth transmission regions 218 of the fourth block 208, the amorphous silicon layer on the region 104 of the substrate 10 is crystallized into polysilicon, forming a plurality of crystalline regions 258. As the width $W_{218}$ of the fourth transmission regions 218 is relatively small, the formed crystalline regions 258 are different from the above crystalline regions 252 or 254 and are referred as irradiated regions 258 in order to distinguish them.

Figure 4B:
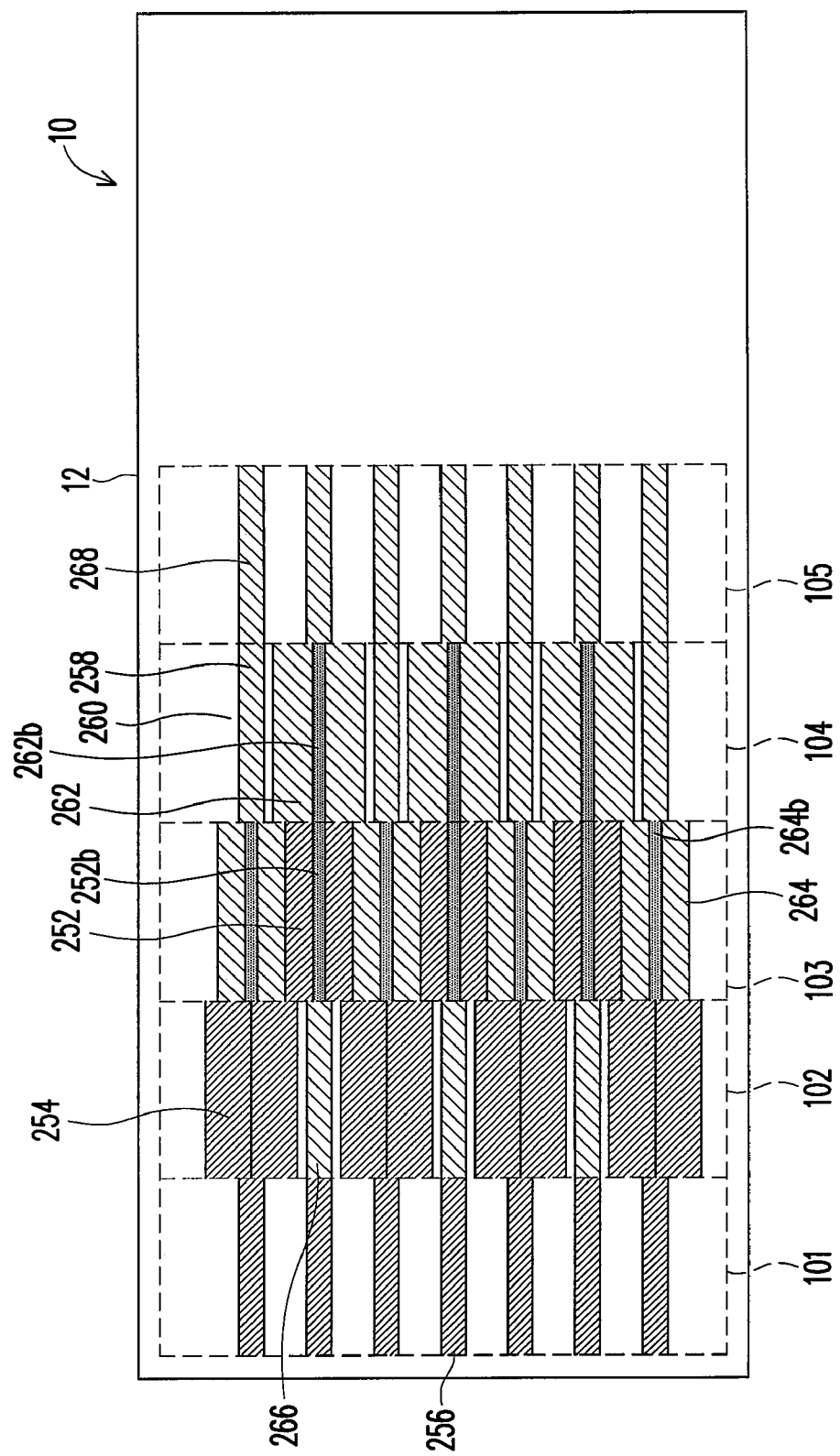

Referring to FIG. 4B, the mask 20 and/or the substrate 10 are moved by a distance, such that the fourth block of the mask 20 is corresponding located above the region 105 of the substrate; the first block 202 is correspondingly located above the region 104 of the substrate 10; the second block 204 is correspondingly located above the region 103 of the substrate 10; and the third block 206 is correspondingly located above the region 102 of the substrate 10. With the laser passing through the fourth transmission regions 218 of the fourth block 208, the amorphous silicon layer on the region 105 of the substrate 10 is crystallized into polysilicon, forming a plurality of irradiated regions 268. With the laser passing through the first transmission regions 212, crystalline regions 262 are formed on the odd-numbered/even-numbered irradiated regions 268 and the amorphous silicon layers there-around on the region 104 of the substrate 10, wherein each of the crystalline regions 262 has a protrusion region 262b. With the laser passing through the second transmission regions 214 and the third transmission regions 216, the variation occurs in the regions 103 and 102, as shown by the regions 103 and 102 of FIG. 3B.

Figure 4C:
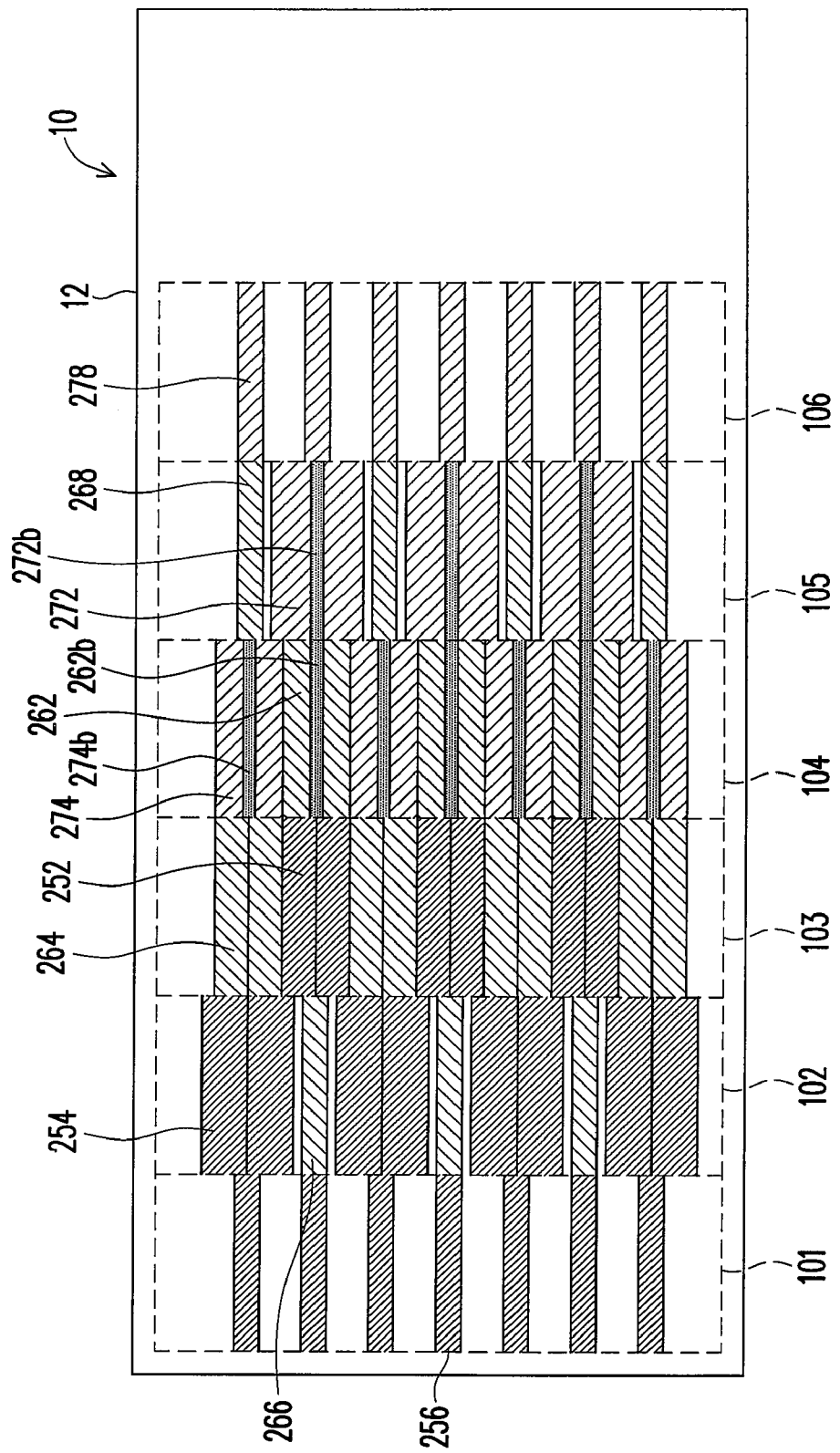

Referring to FIG. 4C, the mask 20 and/or the substrate 10 are moved by a distance, such that the fourth block of the mask 20 is correspondingly located above the region 106 of the substrate; the first block 202 is correspondingly located above the region 105 of the substrate 10; the second block 204 is corresponding located above the region 104 of the substrate 10; and the third block 206 is corresponding located above the region 103 of the substrate 10. With the laser passing through the fourth transmission regions 218 of the fourth block 208, the amorphous silicon layer on the region 106 of the substrate 10 is crystallized into polysilicon, forming a plurality of irradiated regions 278. With the laser passing through the first transmission regions 212, crystalline regions 272 are formed on the odd-numbered/even-numbered irradiated regions 268 and the amorphous silicon layers there-around on the region 105 of the substrate 10, wherein each of the crystalline regions 272 has a protrusion region 272b. With the laser passing through the second transmission regions 212, crystalline regions 274 are formed on the non-crystalline regions 260 between the crystalline regions 262, and on the even-numbered/odd-numbered first irradiated regions 258 on the region 104 of the substrate 10, wherein each of the crystalline regions 274 has a protrusion region 274b. With the laser passing through the third transmission regions 216, the variation occurs in the region 103 as shown by the region 103 of FIG. 3C.

Figure 4D:
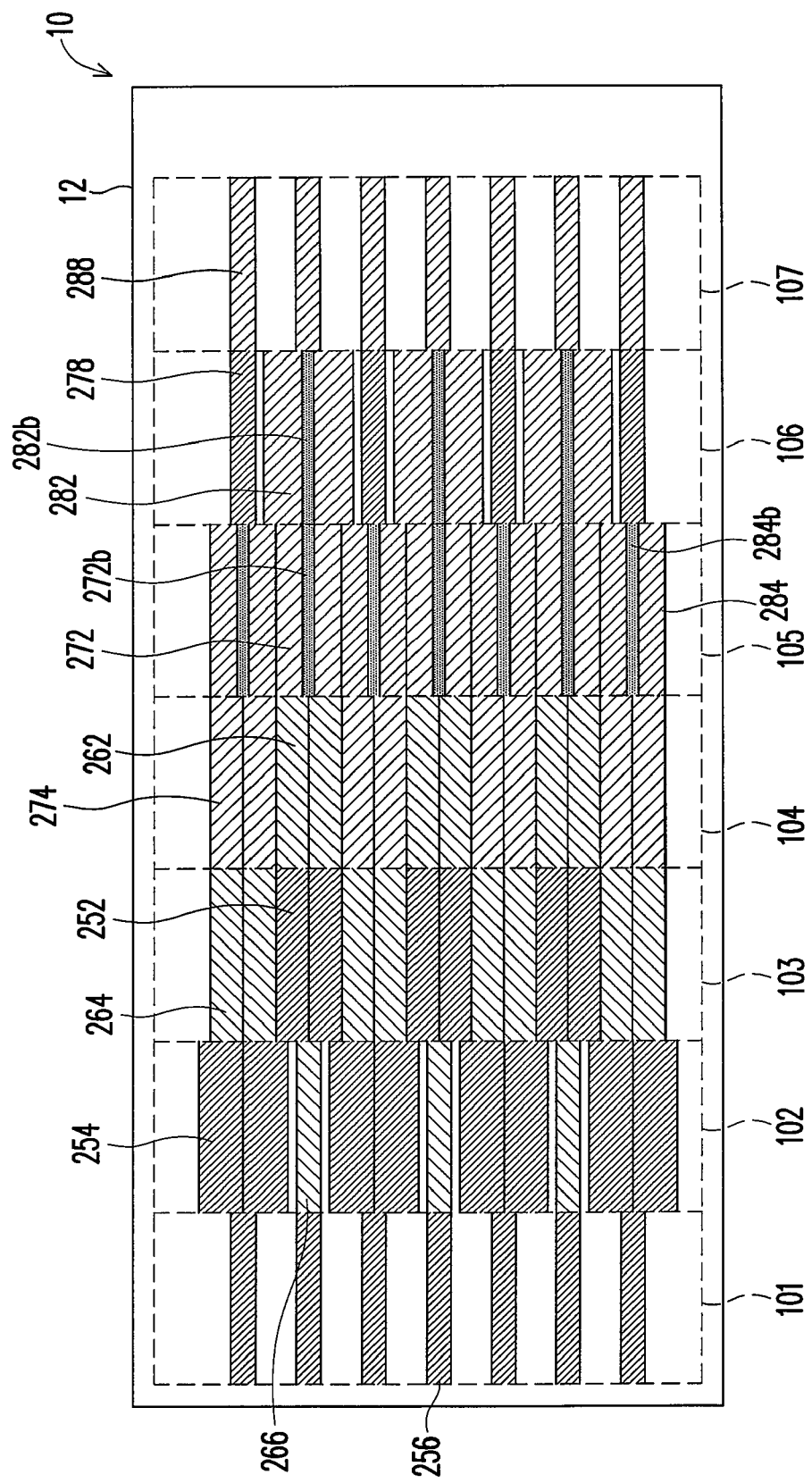

Referring to FIG. 4D, the mask 20 and/or the substrate 10 are moved by a distance, such that the fourth block of the mask 20 is correspondingly located above the region 107 of the substrate; the first block 202 is correspondingly located above the region 106 of the substrate 10; the second block 204 is correspondingly located above the region 105 of the substrate 10; and the third block 206 is correspondingly located above the region 104 of the substrate 10. With the laser passing through the fourth transmission regions 218 of the fourth block 208, the amorphous silicon layer on the region 107 of the substrate 10 is crystallized into polysilicon, forming a plurality of irradiated regions 288. With the laser passing through the first transmission regions 212, crystalline regions 282 are formed on the odd-numbered/even-numbered irradiated region 278 and the amorphous silicon layer there-around on the region 106 of the substrate 10, wherein each of the crystalline regions 282 has a protrusion region 282b. With the laser passing through the second transmission regions 214, crystalline regions 284 are formed on the non-crystalline regions 280 between the crystalline regions 272, and on the even-numbered/odd-numbered irradiated regions 268 on the region 105 of the substrate 10, wherein each of the crystalline regions 284 has a protrusion region 284b. With the laser passing through the third transmission regions 216, the protrusion regions 262b and the protrusion regions 274b on the region 104 of the substrate 10 are flattened.

Figure 4E:
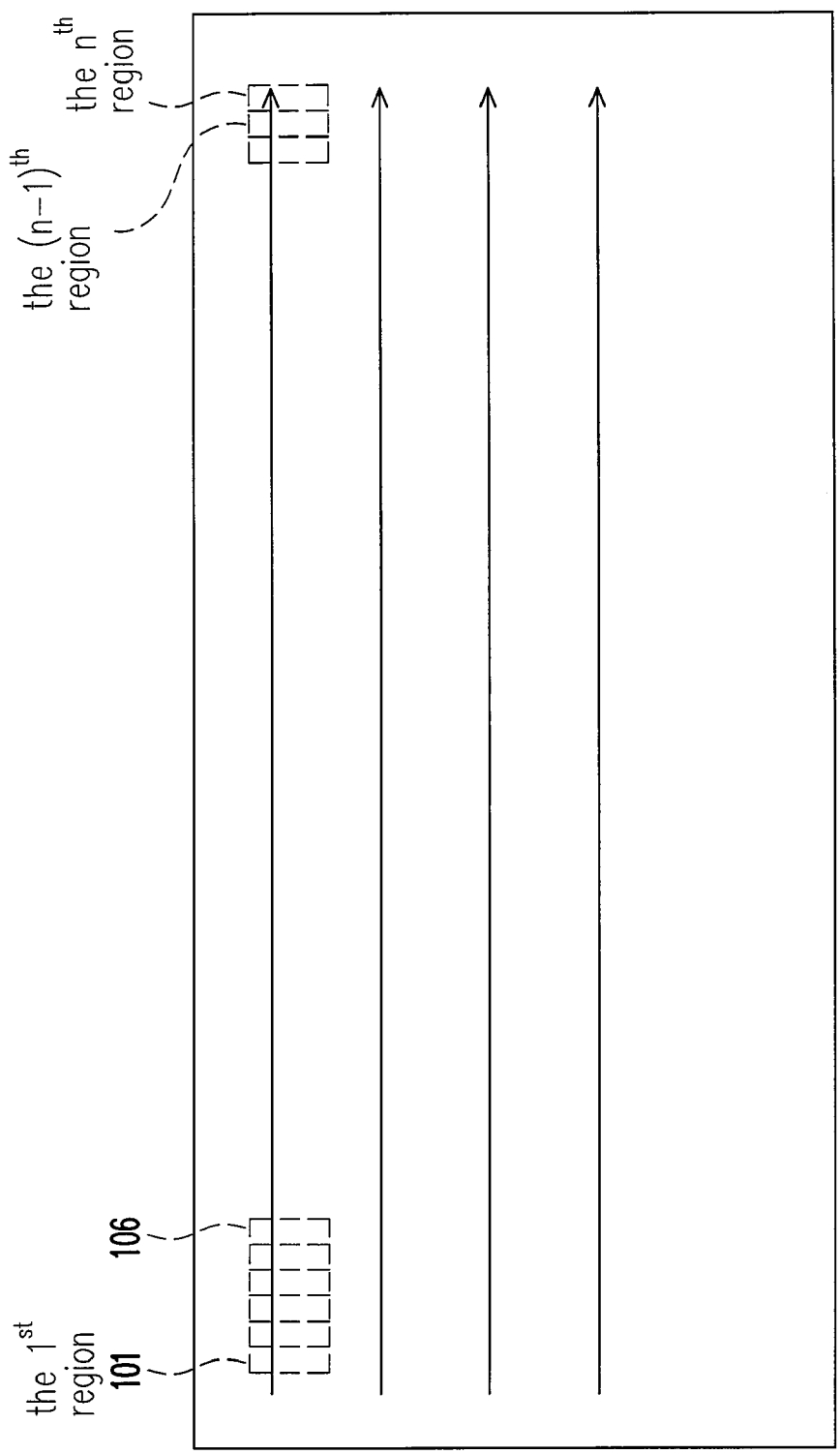
Figure 4E:
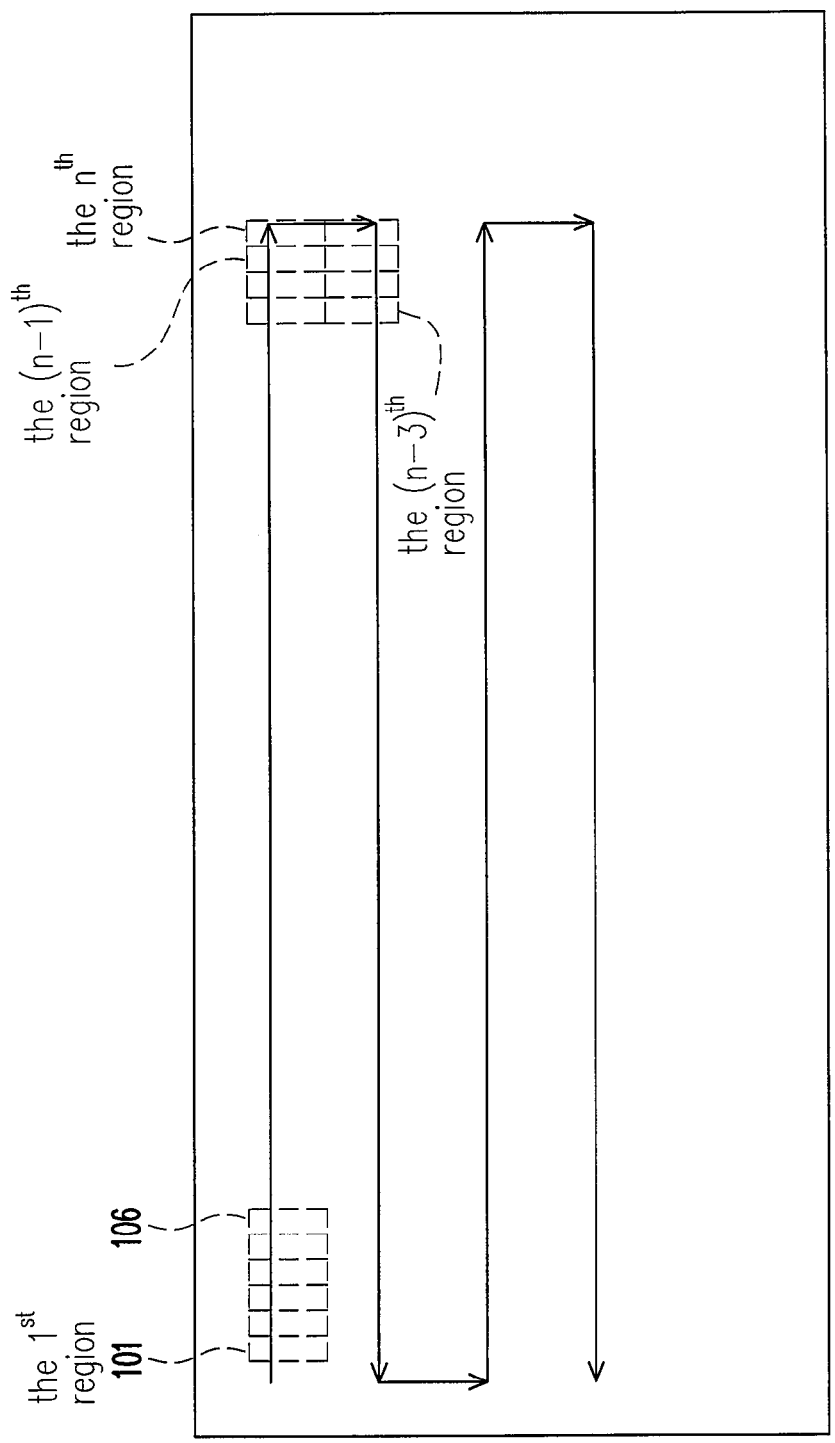

Then, referring to FIG. 4E, the above steps are repeated, such that all of the amorphous silicon layer on the substrate 10 is crystallized into polysilicon, and the boundaries formed are very flat. That is, by way of unidirectional scanning, for example, the amorphous silicon layers on each region in the $2^{nd}$ to $n^{th}$ rows of the substrate 10 are sequentially crystallized into polysilicon from left to right, or the amorphous silicon layers on each region in the $1^{st}$ to $n^{th}$ row of the substrate 10 are sequentially crystallized into polysilicon from right to left.

However, referring to FIG. 4EE, the amorphous silicon layer in each row of the substrate can also be crystallized into polysilicon by way of bidirectional-scanning laser crystallization, instead of unidirectional-scanning laser crystallization. For example, the amorphous silicon layers on each region in the first row of the substrate 10 are crystallized into polysilicon from left to right, and then, the amorphous silicon layers on each region in the second row can be sequentially crystallized into polysilicon from right to left. That is, after the amorphous silicon of the last region in the first row is crystallized into polysilicon, a laser solidification/crystallization begins to be performed to the latter regions, i.e., the $(n-3)^{th}$ to $n^{th}$ regions, in the second row of the substrate 10. Then, the mask 40 or/and the substrate 10 are moved, such that the mask 40 is moved towards the first region 101 of the substrate 10, and thereby, the amorphous silicon layers on each region of the second row is sequentially crystallized into polysilicon. Then, the solidification/crystallization process for the regions in the odd-numbered rows of the substrate 10 can be achieved through the same way as that of the first row; the solidification/crystallization process for the regions in the even-numbered rows can be achieved through the same way as that of the second row. In other words, the mask 40 can be used for bidirectional laser crystallization, so as to reduce the time cost of long-distance moving of the substrate or the mask, thereby increasing the capability of mass production.

Third Embodiment

Figure 5:
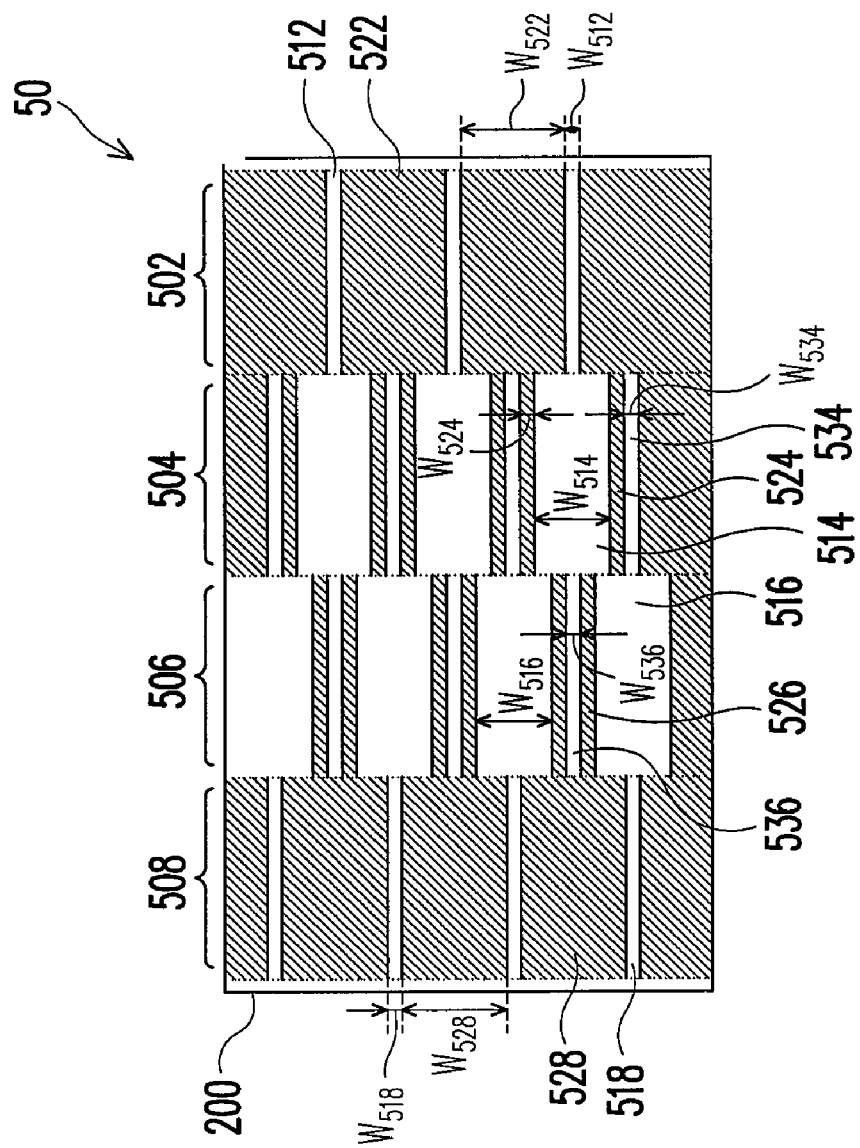
FIG. 5 is a schematic view of a mask used for crystallizing amorphous silicon according to a third embodiment of the present invention.

Referring to FIG. 5, the present invention provides a mask 50, which includes a transparent substrate 10. The transparent substrate 10 can be divided into a first block 502, a second block 504, a third block 506, and a fourth block 508 being arranged adjacently and having the same size. The first block 502 includes a plurality of transmission regions 512 and a plurality of opaque regions 522 located between the transmission regions 512. The second block 504 includes a plurality of transmission regions 514, a plurality of transmission regions 534, and a plurality of opaque regions 524, wherein each of the transmission regions 514 is located between two adjacent transmission regions 534; each of the opaque regions 524 is located between the adjacent transmission region 514 and transmission region 534; the transmission regions 514 are arranged such that the positions of the transmission regions 512 are substantially at the centers of the transmission regions 514; and the transmission regions 534 are arranged corresponding to the opaque regions 522. The third block includes a plurality of transmission regions 516, a plurality of transmission regions 536, and a plurality of opaque regions 526, wherein each of the transmission regions 516 is located between two adjacent transmission regions 536; the opaque region 526 is located between the adjacent transmission region 516 and transmission region 536; the transmission regions 516 are arranged such that the positions of the transmission regions 534 are substantially at the centers of the transmission regions 516; and the transmission regions 536 are arranged corresponding to the centers of the transmission regions 514. The fourth block 508 includes a plurality of transmission regions 518 and a plurality of opaque regions 528, wherein the transmission regions 518 are arranged corresponding to the centers of the transmission regions 516, and the opaque regions 528 are located between the transmission regions 518.

The width $W_{514}$ of the transmission regions 514 is larger than the width $W_{512}$ of the transmission regions 512, and is larger than the width $W_{536}$ of the transmission regions 536. The width $W_{516}$ of the transmission regions 516 is larger than the width $W_{534}$ of the transmission regions 534, and is larger than the width $W_{518}$ of the transmission regions 518. Moreover, the widths $W_{514}$ and $W_{516}$ of the transmission regions 514 and 516 can be the same or different, but both are determined to be large enough that the width of the crystalline region formed in the amorphous silicon is no larger than twice the length of the maximum grain growth after the amorphous silicon is irradiated by a laser used for the direct irradiation or passing through a laser optical system. The widths $W_{512}$, $W_{534}$, $W_{536}$ and $W_{518}$ of the transmission regions 512, 534, 536 and 518 can be the same or different, but they are determined to be large enough that the protrusion regions of the crystalline regions formed in the amorphous silicon may be flattened after being irradiated by the laser passing through the transmission regions 514 and 516.

Figure 6A:
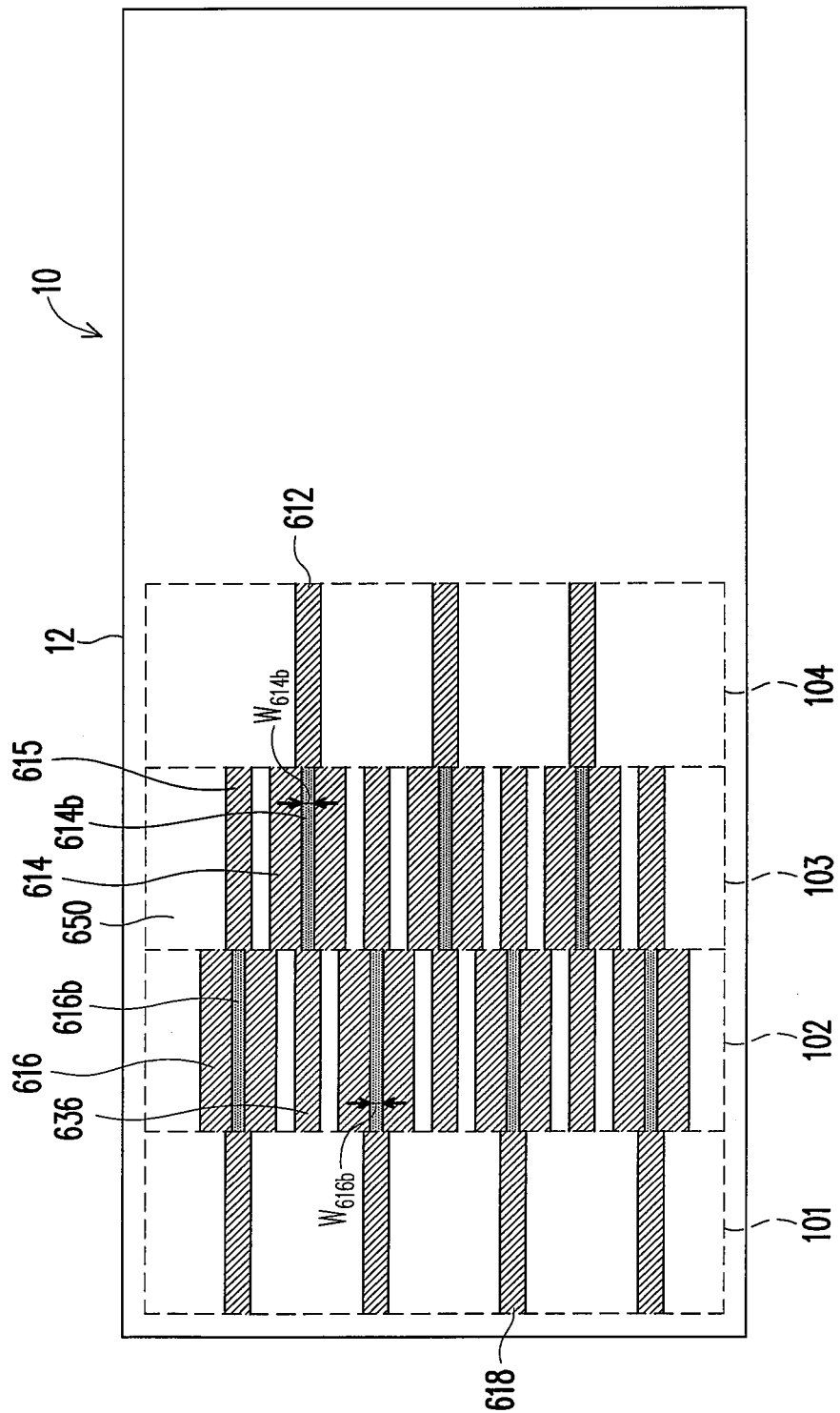
FIGS. 6A to 6D are cross-sectional views of a flow for crystallizing amorphous silicon according to the third embodiment of the present invention.

Referring to FIG. 6A, when the above mask 50 is used for crystallizing an amorphous silicon layer, the block 502 of the mask 50 corresponds to the region 104 of the substrate 10; the block 504 corresponds to the region 103 of the substrate 10; the block 506 corresponds to the region 102 of the substrate 10; and the block 508 corresponds to the region 101 of the substrate 10. With the laser passing through the transmission regions 512, 534, 536, and 518, irradiated regions 612, 615, 636, and 618 are formed in the amorphous silicon layer of the regions 104 and 103 of the substrate 10. With the laser passing through the transmission regions 514 and 516, crystalline regions 614 and 616 are formed on the amorphous silicon layer of the regions 103 and 102 of the substrate 10. Each of the crystalline regions 614 and 616 has a protrusion region 614b and 616b respectively.

Figure 6B:
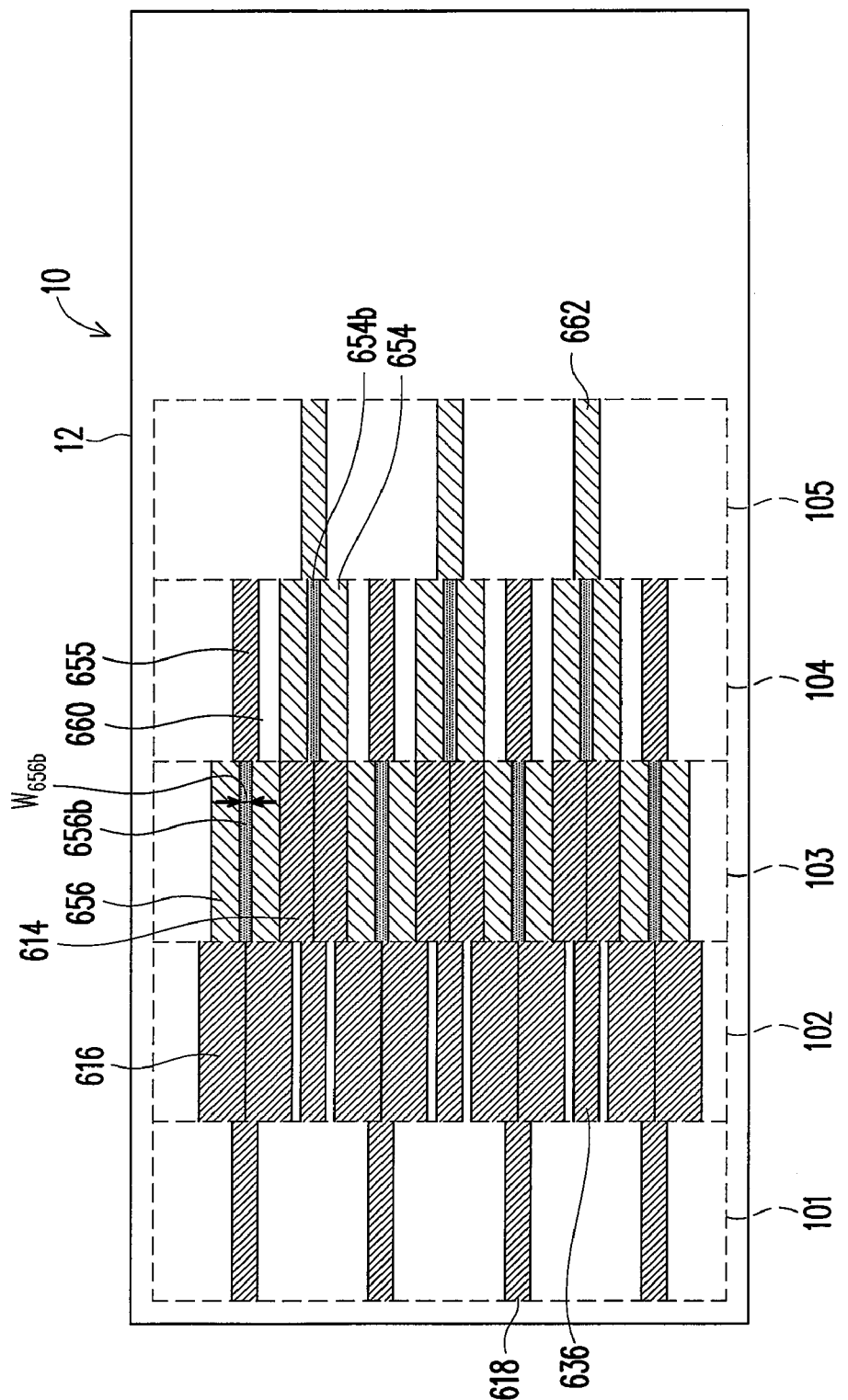

Referring to FIG. 6B, the mask 50 and/or the substrate 10 are moved by a distance, such that the first, second, third, and fourth blocks of the mask 50 are correspondingly located above the regions 105, 104, 103, and 102 of the substrate 10 respectively. With the laser passing through the transmission regions 512, 534, and 514, the amorphous silicon layers on the regions 105 and 104 are crystallized into polysilicon, such that irradiated regions 662, irradiated regions 655, and crystalline regions 654 are formed respectively. Each of the crystalline regions 654 has a protrusion region 654b. With the laser passing through the transmission regions 516, crystalline regions 656 are formed on the non-crystalline regions 650 between the crystalline regions 614, and on the irradiated regions 615, wherein each of the crystalline regions 656 has a protrusion region 656b. Since the widths $W_{536}$ and $W_{518}$ of the transmission regions 536 and 518 are large enough, the laser passing through the transmission regions 536 and 518 enables the protrusion regions 614b and 616b to be melted and then solidified, and thereby become relatively flat.

Figure 6C:
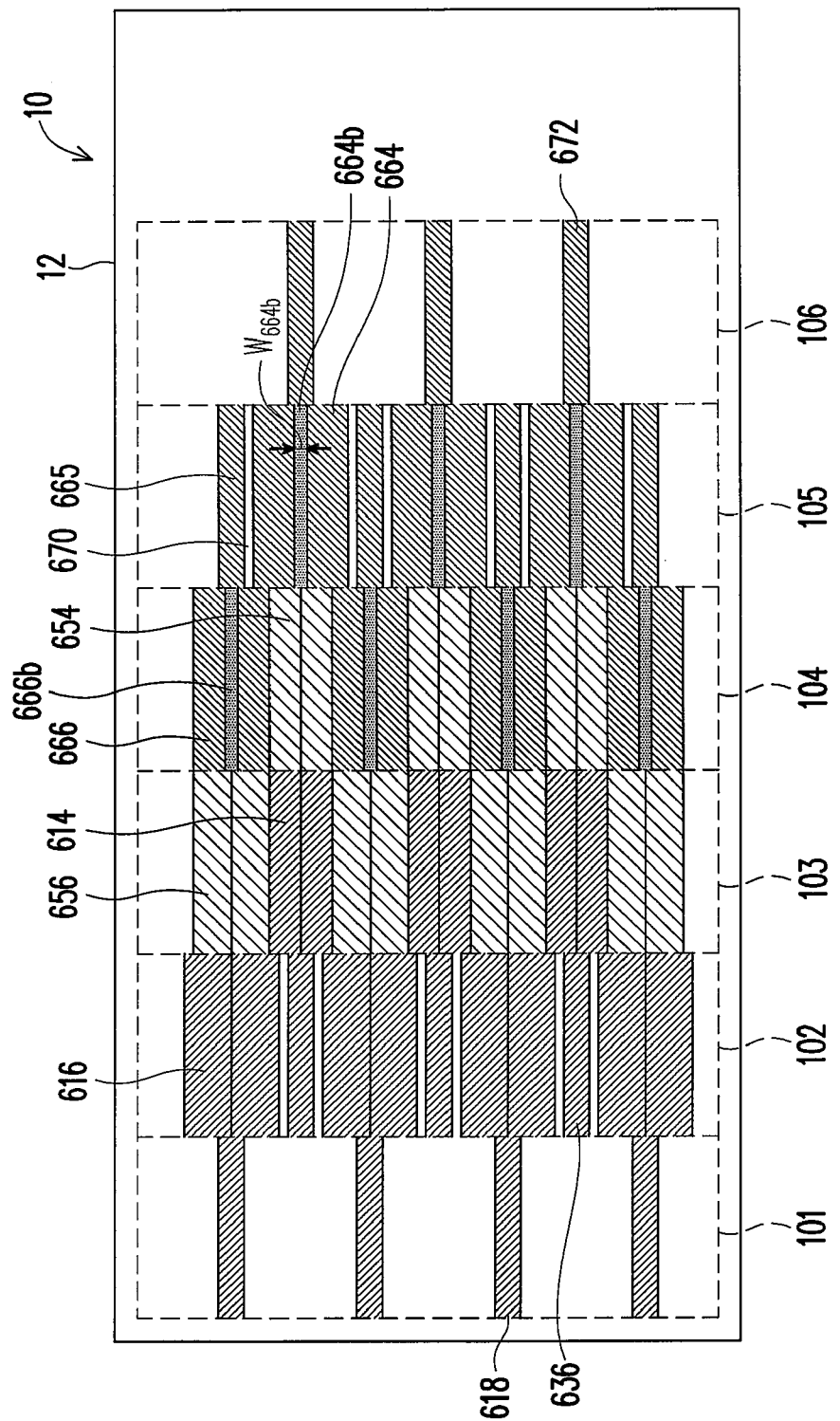

Referring to FIG. 6C, the mask 50 and/or the substrate 10 are moved by a distance, such that the first, second, third, and fourth blocks of the mask 50 are correspondingly located above the regions 106, 105, 104, and 103 of the substrate 10. With the laser passing through the transmission regions 512, 534, and 514, the amorphous silicon layers on the regions 106 and 105 are crystallized into polysilicon, such that irradiated regions 672, irradiated regions 665, and crystalline regions 664 are formed. Each of the crystalline regions 664 has a protrusion region 664b. With the laser passing through the transmission regions 516, crystalline regions 666 are formed on the non-crystalline regions 660 between the crystalline regions 654, and on the irradiated regions 664, wherein each of the crystalline regions 666 has a protrusion region 666b. Since the widths $W_{536}$ and $W_{518}$ of the transmission regions 536 and 518 are large enough, the laser passing through the transmission regions 536 and 518 enables the protrusion regions 654b of the region 104 and the protrusion regions 656b of the region 103 to be melted and then solidified, and thereby become relatively flat. Thus, the amorphous silicon layer in the region 103 has already been crystallized into polysilicon, the boundaries of the formed crystalline regions 656 and 614 are flatter than those conventional ones.

Figure 6D:
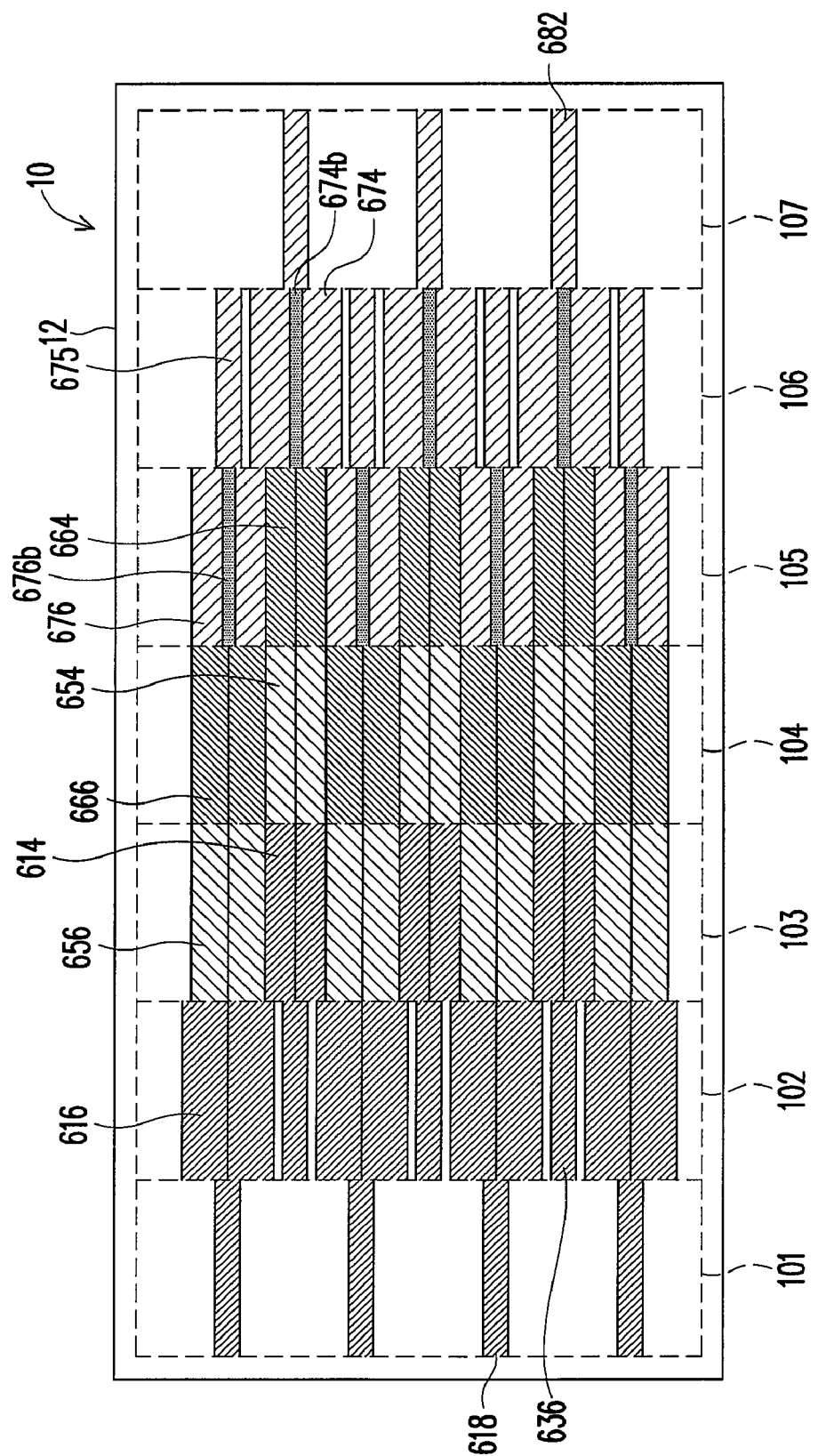

Referring to FIG. 6D, the mask 50 and/or the substrate 10 are moved by a distance, such that the first, second, third, and fourth blocks of the mask 50 are corresponding located above the regions 107, 106, 105, and 104 of the substrate 10 respectively. With the laser passing through the transmission regions 512, 534, and 514, the amorphous silicon layers on the regions 107 and 106 are crystallized into polysilicon, such that irradiated regions 682, irradiated regions 675, and crystalline regions 674 are formed respectively. Each of the crystalline regions 674 has a protrusion region 674b. With the laser passing through the transmission regions 516, crystalline regions 676 are formed on the non-crystalline region 670 between the crystalline regions 664, and on the irradiated region 665, wherein each of the crystalline regions 676 has a protrusion region 676b. The laser passing through the transmission regions 536 and 518 are sufficient for the protrusion regions 664b of the region 105 and the protrusion regions 666b of the region 104 to be flattened. Thus, the amorphous silicon layers in the regions 103 and 104 have already been crystallized into polysilicon, and the boundaries of the formed crystalline regions are flatter than those conventional ones.

Then, through the unidirectional-scanning laser crystallization, such as the method shown in FIG. 4E of the third embodiment, or through the bidirectional-scanning laser crystallization, such as the method shown in FIG. 4 EE, the amorphous silicon layer on each region is irradiated by the laser sequentially, and is thereby crystallized into polysilicon.

Fourth Embodiment

The present invention further provides a method for crystallizing amorphous silicon. Two masks are used herein to crystallize amorphous silicon, wherein the first mask is used to crystallize the amorphous silicon layer into polysilicon region by region, and the second mask is used to enable the protrusion regions of the formed polysilicon to be flattened, which is described below in great detail.

Figures 7, 8:
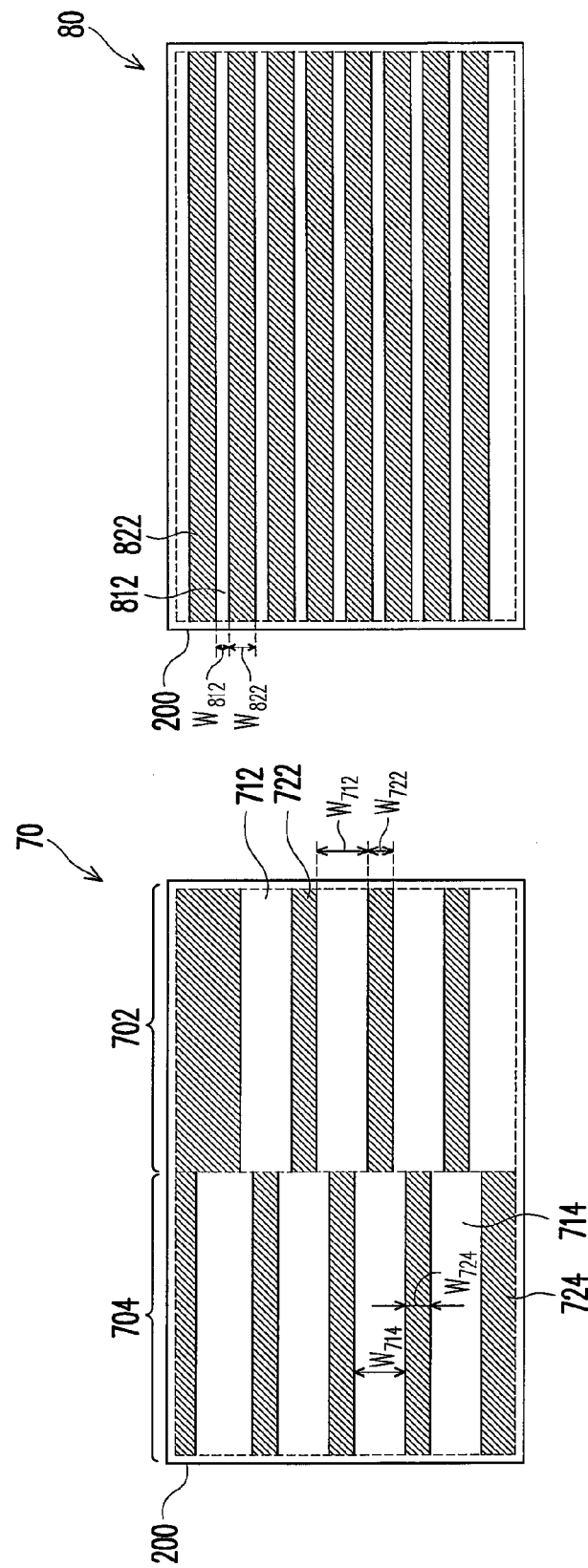
FIGS. 7 and 8 are schematic views of the masks used for crystallizing amorphous silicon according to a fourth embodiment of the present invention.

FIGS. 7 and 8 show two masks 70 and 80 used in the fourth embodiment of the present invention respectively.

Referring to FIG. 7, the mask 70 is formed on a transparent substrate 200, and includes a first block 702 and a second block 704 being adjacent to each other and having the same size. The first block 702 includes a plurality of first transmission regions 712 and a plurality of first opaque regions 722 located between the first transmission regions 712. The second block 704 includes a plurality of second transmission regions 714 and a plurality of second opaque regions 724, wherein the second opaque regions 724 are located between the first transmission regions 714; the second opaque regions 724 are arranged corresponding to the centers of the first transmission regions 712; the second transmission regions 714 are arranged such that the positions of the first opaque regions 722 are substantially at the centers of the second transmission regions 714. The width $W_{712}$ of the first transmission regions 712 is larger than the width $W_{724}$ of the second opaque regions 724, and the width $W_{714}$ of the second transmission regions 714 is larger than the width $W_{722}$ of the first opaque regions 722. Moreover, the widths $W_{712}$ and $W_{714}$ of the first transmission regions 712 and the second transmission regions 714 can be the same or different, but both are determined in such a way that the width of the crystalline regions formed in the amorphous silicon is no larger than twice the length of the maximum grain growth after being irradiated by a laser used for the direct irradiation or passing through a laser optical system.

Referring to FIG. 8, the second mask 80 is formed on a transparent substrate 201, with the size being equal to that of the first mask 70, with the length being about twice the length of the block 702 or block 704. The mask 80 includes a plurality of transmission regions 812 and opaque regions 822, wherein the opaque regions 822 are located between the transmission regions 812; the transmission regions 812 correspond to the centers of the first transmission regions 712, and correspond to the centers of the second transmission regions 714. The width $W_{812}$ of the transmission regions 812 is less than the width $W_{712}$ of the first transmission regions 712, and is less than the width $W_{714}$ of the second transmission regions 714. Moreover, since the width $W_{812}$ of the transmission regions 812 is large enough, the protrusion regions in the formed crystalline regions are flattened, after the amorphous silicon is irradiated by the laser.

Figure 9A:
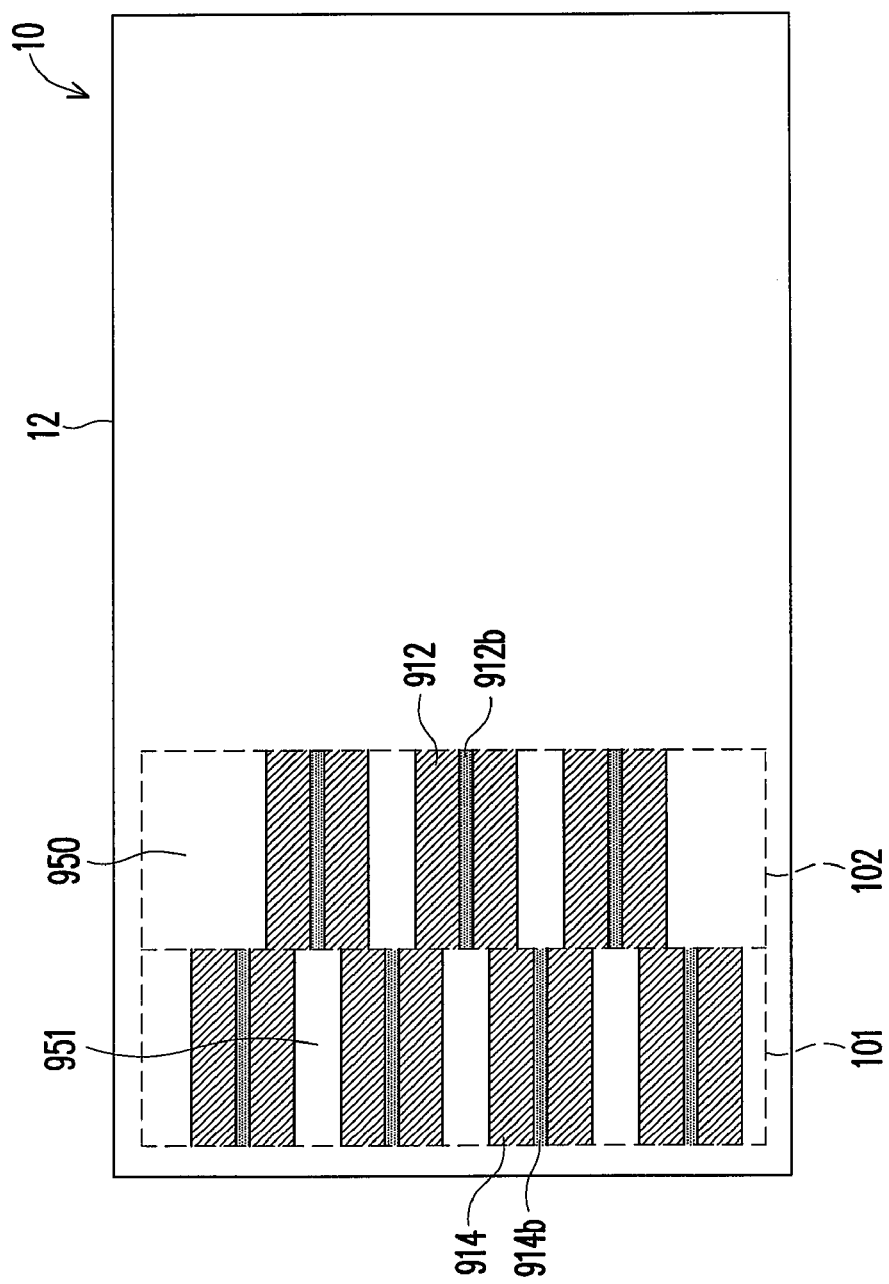
FIGS. 9A to 9GG are cross-sectional views of a flow for crystallizing amorphous silicon according to the fourth embodiment of the present invention.

Referring to FIG. 9A, when the two masks 70 and 80 are used for crystallizing amorphous silicon 12, the first mask 70 is firstly used as a mask, such that the first block 702 corresponds to the region 102 of the substrate 10, and the second block 704 corresponds to the region 101 of the substrate 10. With the laser passing through the transmission regions 712 and 714, crystalline regions 912, 914 are formed on the regions 102 and 101 respectively. The crystalline regions 912 and 914 have protrusion regions 912b and 914b respectively.

Figure 9B:
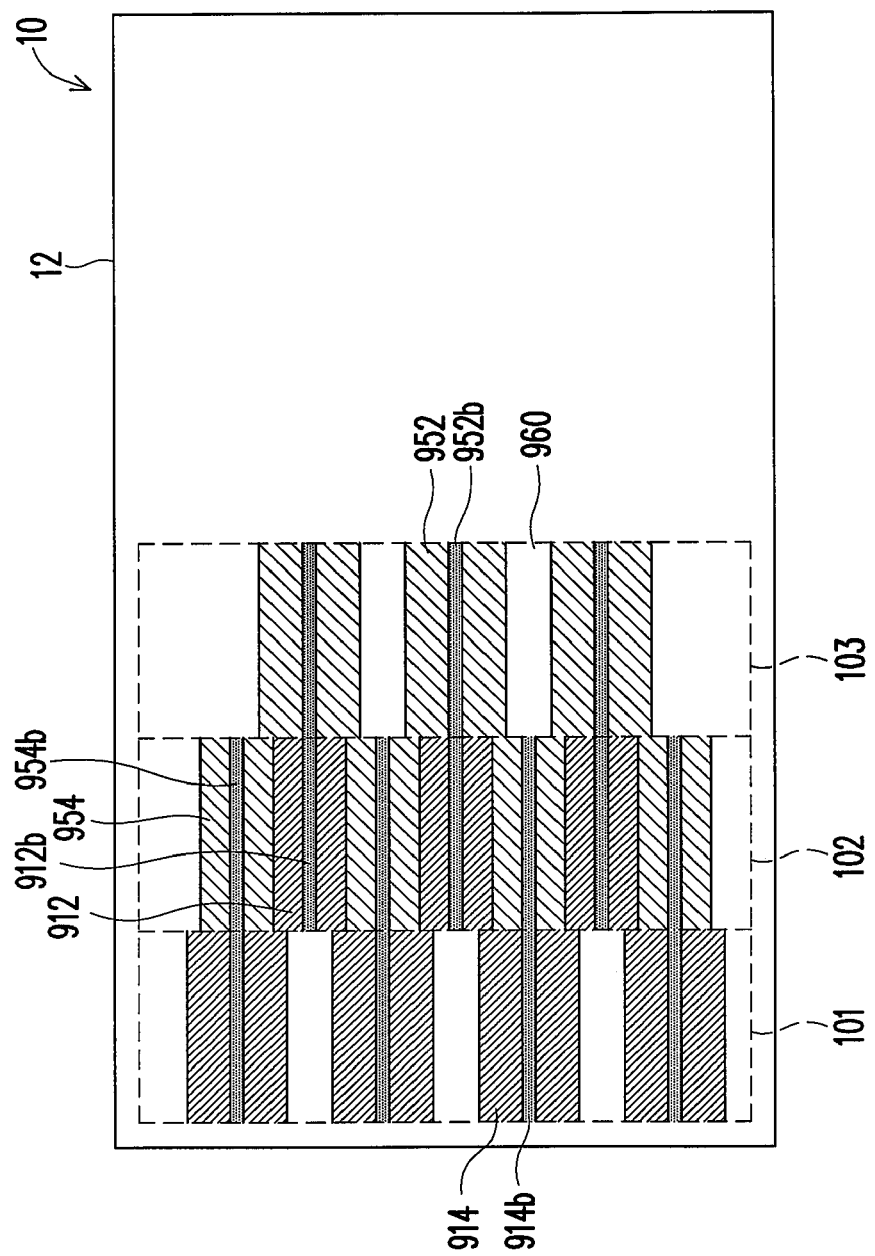

Then, referring to FIG. 9B, the mask 70 and/or the substrate 10 are moved by a distance, such that the first block 702 of the mask 70 corresponds to the region 103 of the substrate 10, and the second block 704 corresponds to the region 102 of the substrate 10. For example, when the substrate 10 is disposed on a base, the base can be moved, and the moving distance is no larger than half of the length of the mask 70. With the laser passing through the transmission regions 712 and 714, crystalline regions 952 are formed on the amorphous silicon 12 of the region 103, wherein each of the crystalline regions 952 has a protrusion region 952b. With the laser passing through the transmission regions 714, crystalline regions 954 are formed in the amorphous silicon of the non-crystalline regions 950 between the crystalline regions 912 of the region 102, wherein each of the crystalline regions 954 has a protrusion region 954b.

Figure 9C:
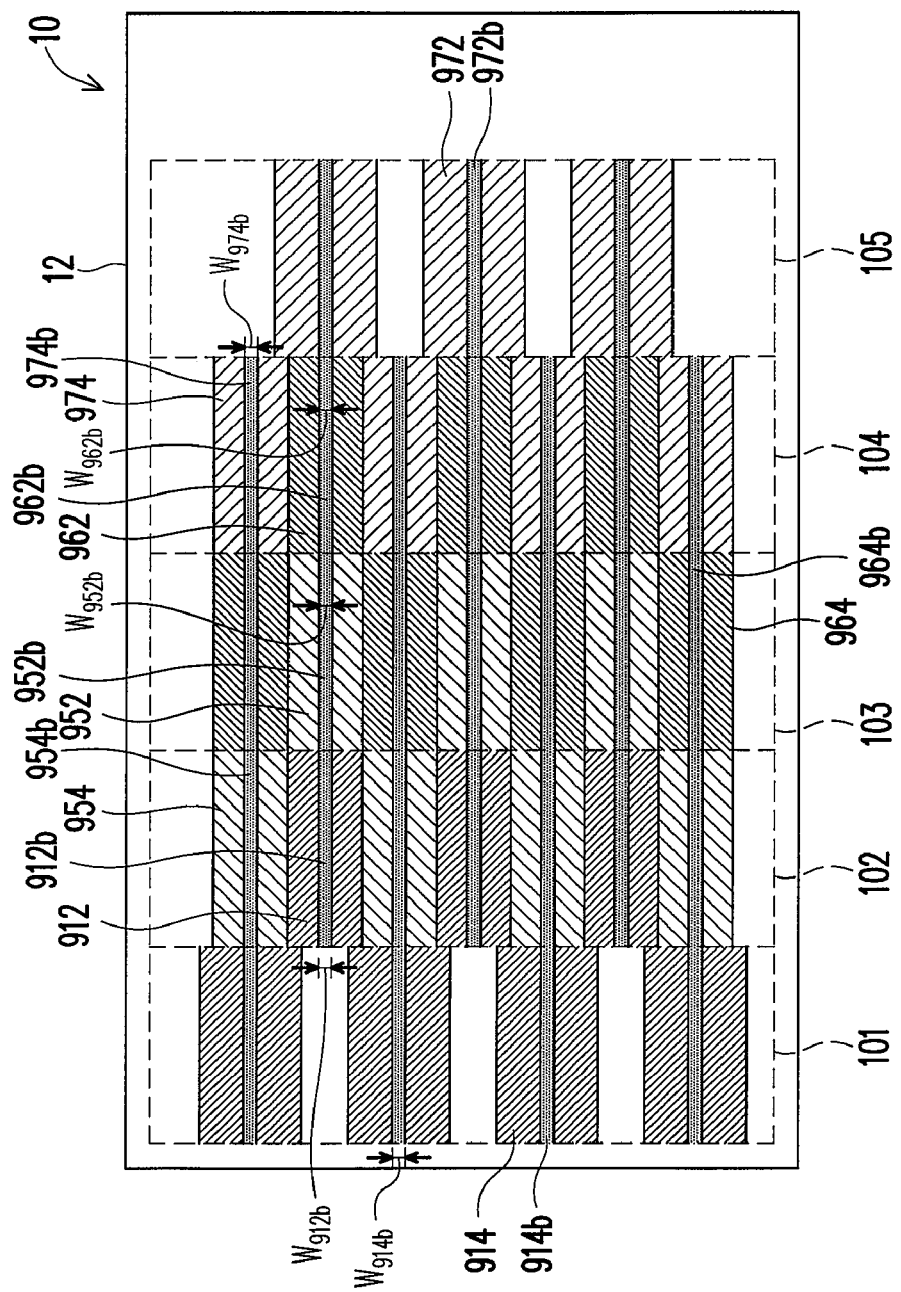

Then, referring to FIG. 9C, the first block 702 of the mask 70 corresponds to the blocks 104 and 105 of the substrate 10 sequentially, for crystallizing the amorphous silicon 12 through laser, such that crystalline regions 964 and 962 are formed in the regions 104 and 103 sequentially, and crystalline region 972 and 974 are formed in the regions 105 and 104, wherein each of the crystalline regions 964, 962, 972 and 974 has a protrusion region 964b, 962b, 972b and 974b respectively.

Referring to 9D, through the unidirectional-scanning laser crystallization, such as the method shown in FIG. 4E of the third embodiment, the amorphous silicon layer on each region is irradiated by the laser sequentially, and crystallized into polysilicon.

Figure 9D:
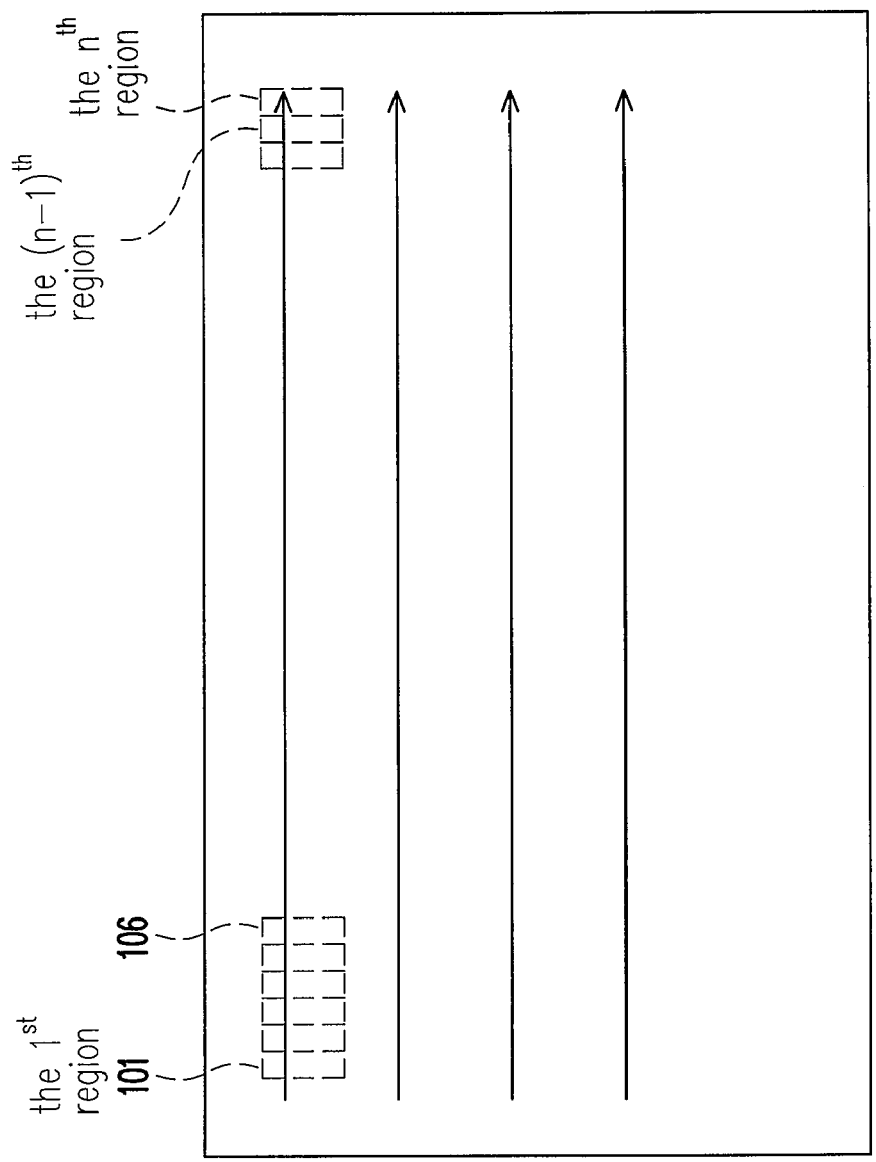
Figure 9D:
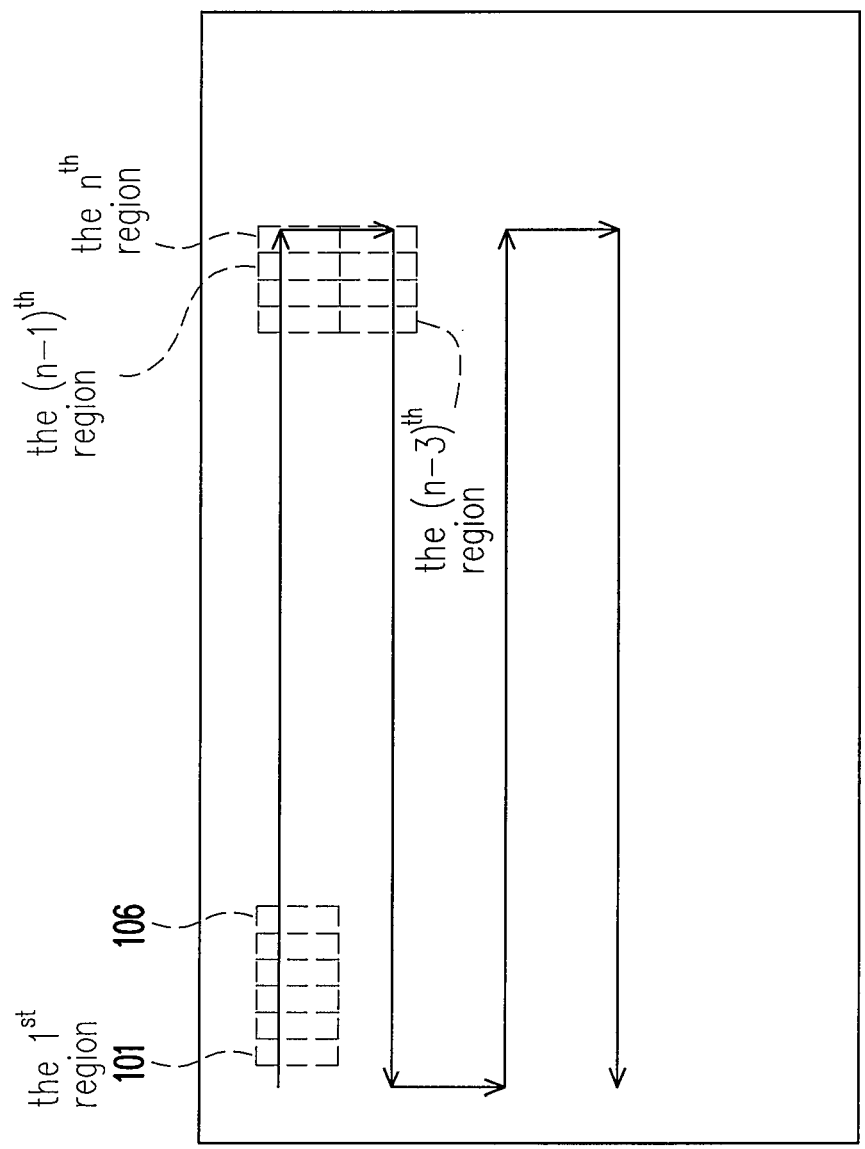

Alternatively, referring to FIG. 9DD, through the bidirectional-scanning laser crystallization, such as the method shown in FIG. 4EE, the amorphous silicon layer on each region is irradiated with the laser sequentially, and crystallized into polysilicon. More particularly, with the laser passing through the transmission region 714 and the transmission region 712 with the first mask 70 as a mask, a plurality of crystalline regions is formed on the $(n-1)^{th}$ region and the $n^{th}$ region in the second row of the substrate 10. Then, the substrate 10 and/or the first mask 70 are moved, such that the block 704 of the first mask 70 is shifted to the $(n-2)^{th}$ region; the block 702 of the first mask 70 is shifted to the $(n-1)^{th}$ region of the substrate. With a laser passing through the transmission regions 714 and 712, a plurality of second crystalline regions is formed on the plurality of non-crystalline regions between the first crystalline regions of the $(n-1)^{th}$ region of the substrate 10. With the laser passing through the first transmission regions, a plurality of first crystalline regions is formed on the $(n-2)^{th}$ region of the substrate 10. Each of the first crystalline regions of the third region and each of the second crystalline regions of the second region have a protrusion region respectively. Then, the above steps are repeated, such that a plurality of first crystalline regions and a plurality of second crystalline regions are formed on each region in the second row of the substrate 10. Then, through the above method for forming the first crystalline regions and the second crystalline regions on each region in the first row of the substrate 10, a plurality of first crystalline regions and a plurality of second crystalline regions are formed on each region in the odd-numbered rows of the substrate, and through the method for forming the first crystalline regions and the second crystalline regions on each region in the second row of the substrate 10, a plurality of first crystalline regions and a plurality of second crystalline regions are formed on each region in the even-numbered rows of the substrate.

Figure 9E:
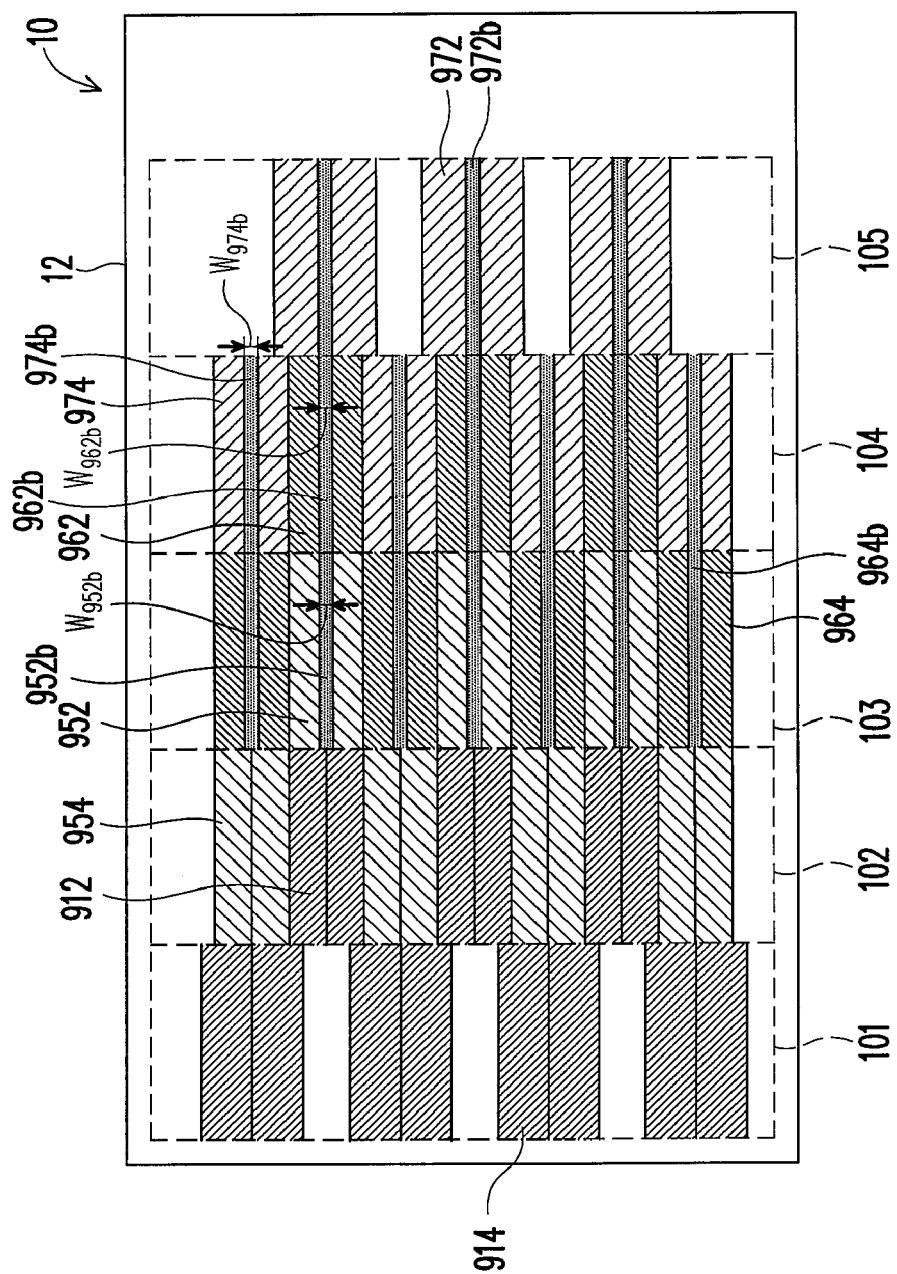

Referring to FIG. 9E, the first mask 70 is removed, and a second mask 80 is disposed above the regions 102 and 101 of the substrate 10. Then, the transmission regions 812 of the second mask 80 are aligned with the protrusion regions 954b, 914b and 912b, and the laser passes through the transmission regions 812. The width $W_{812}$ Of the transmission regions 812 is large enough for the protrusion regions 914b, 954b and 912b to be flattened after being irradiated by the laser.

Figure 9F:
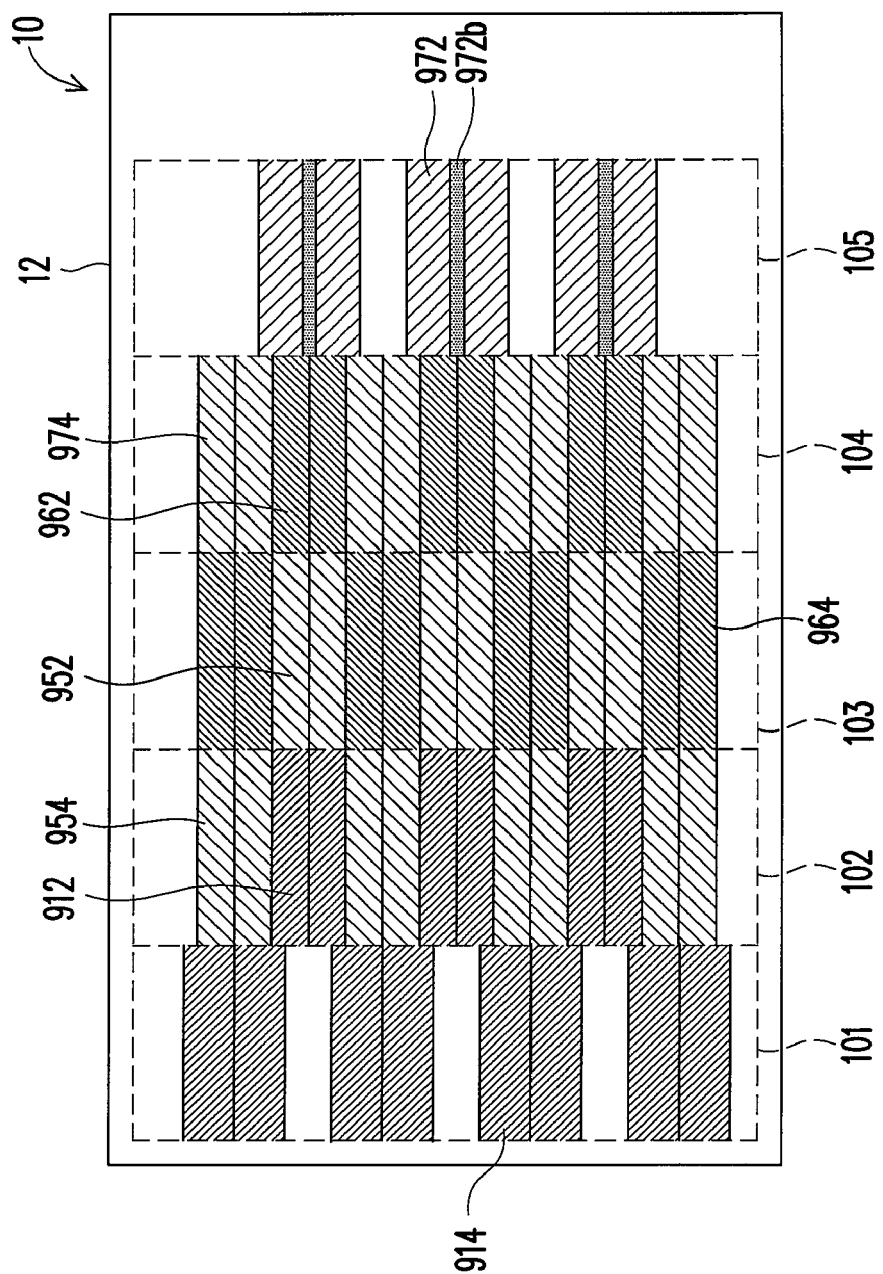

Referring to FIG. 9F, the mask 80 and/or the substrate 10 are moved by a distance, and the mask 80 is disposed above the regions 104 and 103 of the substrate 10, wherein the transmission regions 812 are aligned with the protrusion regions 974b, 964b, 962b and 952b. Then, the laser passes through the transmission regions 812. The width $W_{812}$ of the transmission regions 812 is large enough for the protrusion regions 974b, 964b, 962b and 952b to be flattened after being irradiated by the laser.

Figure 9G:
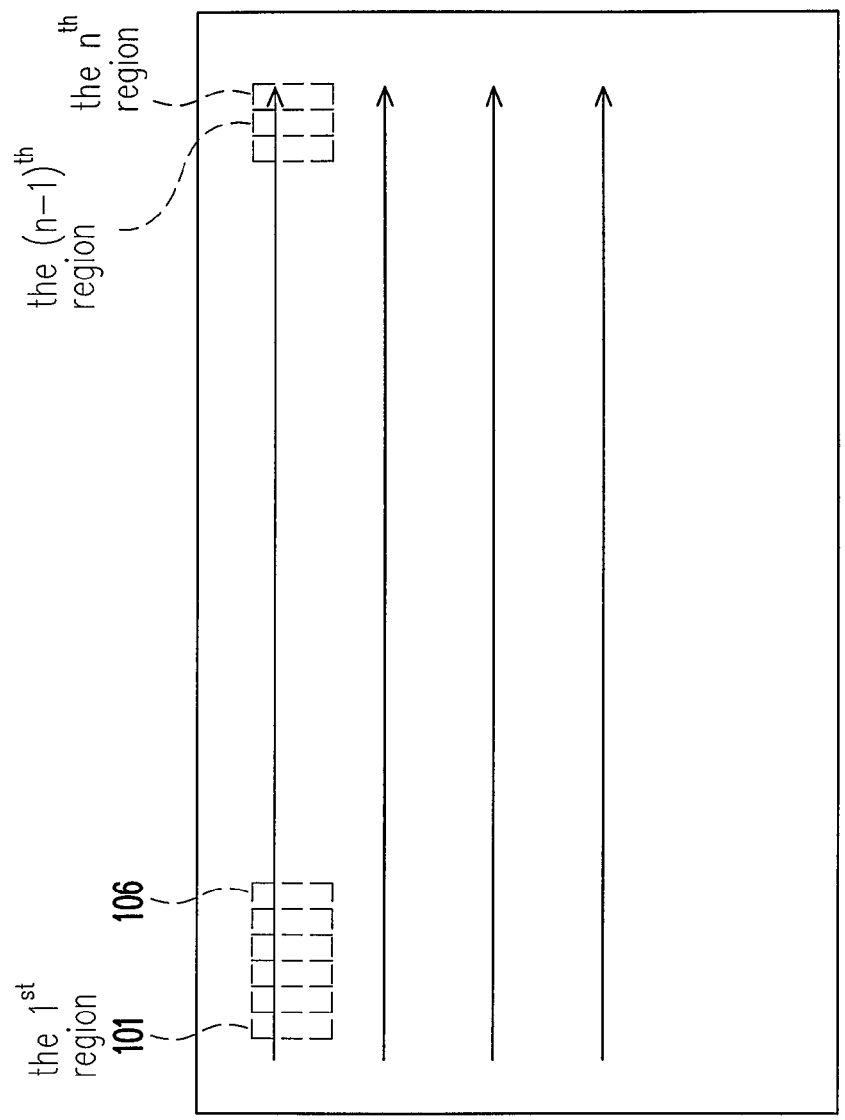
Figure 9G:
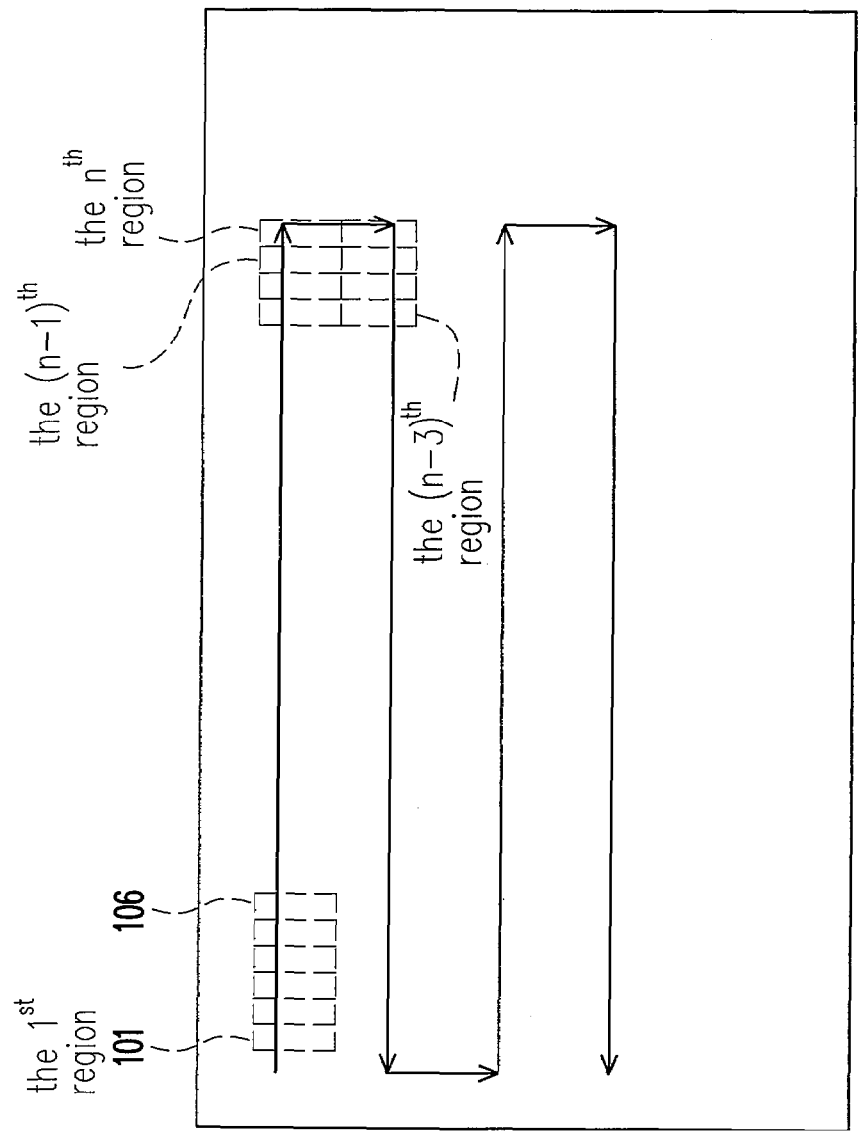

Referring to FIG. 9G, through the unidirectional-scanning laser crystallization, such as the method shown in FIG. 4E of the third embodiment, the protrusion regions in crystalline regions formed in each region are sequentially flattened.

Alternatively, referring to FIG. 9GG, through the bidirectional-scanning laser crystallization, such as the method shown in FIG. 4 EE, the protrusion regions of the crystalline regions formed in each region are sequentially flattened. More particularly, the substrate 10 and/or the mask 80 are moved, such that the mask 80 is shifted to the $(n-1)^{th}$ region and the $n^{th}$ region in the second row. With the laser passing through the transmission regions 812, the protrusion regions in the crystalline regions formed on the $(n-1)^{th}$ region and the $n^{th}$ region in the second row of the substrate 10 are flattened. Then, the substrate 10 and/or the mask 80 are moved, such that the mask 80 is shifted to the $(n-3)^{th}$ region and the $(n-2)^{th}$ region. With a laser passing through the transmission regions 812, the protrusion regions of the $(n-3)^{th}$ region and the $(n-2)^{th}$ region are melted and then solidified. Then, the above steps are repeated, such that the protrusion regions on each region of the second row of the substrate 10 are melted and then solidified. Then, through the above method for melting and solidifying the protrusion regions on each region of the first row of the substrate 10, the protrusion regions on each region of the odd-numbered rows of the substrate are melted and then solidified, and through the above method for melting and solidifying the protrusion regions on each region of the second row of the substrate 10, the protrusion regions on each region of the even-numbered rows of the substrate are melted and then solidified.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A mask, suitable for laser-crystallizing amorphous silicon into polysilicon, comprising:
   a transparent substrate, including a first block, a second block, and a third block of the same size, wherein the second block is located between the first block and the third block;
   the first block includes a plurality of first transmission regions and a plurality of first opaque regions located between the first transmission regions;
   the second block includes a plurality of second transmission regions corresponding to the first opaque regions and a plurality of second opaque regions corresponding to the first transmission regions and located between the second transmission regions; and
   the third block includes a plurality of third transmission regions arranged corresponding to the centers of the first transmission regions and corresponding to the centers of the second transmission regions, and a plurality of third opaque regions located between the third transmission regions.

2. The mask as claimed in claim 1, wherein the transparent substrate further includes a fourth block being adjacent to one side of the first block that is not adjacent to the second block, having the same size as the first, second, and third blocks, and including a plurality of fourth transmission regions and a plurality of fourth opaque regions, wherein:
   the fourth transmission regions are arranged corresponding to the centers of the first transmission regions and corresponding to the centers of the second transmission regions; and
   the fourth opaque regions are located between the fourth transmission regions.

3. The mask as claimed in claim 2, wherein the width of the first transmission regions is larger than that of the second opaque regions.

4. The mask as claimed in claim 3, wherein the width of the second opaque regions is larger than that of the third transmission regions and is larger than that of the fourth transmission regions.

5. The mask as claimed in claim 2, wherein the width of the second transmission regions is larger than that of the first opaque regions.

6. The mask as claimed in claim 5, wherein the width of the first opaque regions is larger than that of the third transmission regions and is larger than that of the fourth transmission regions.

7. The mask as claimed in claim 1, wherein the width of the first transmission regions is larger than that of the second opaque regions.

8. The mask as claimed in claim 7, wherein the width of the second opaque regions is larger than that of the third transmission regions.

9. The mask as claimed in claim 1, wherein the width of the second transmission regions is larger than that of the first opaque regions.

10. The mask as claimed in claim 9, wherein the width of the first opaque regions is larger than that of the third transmission regions.

11. A method for crystallizing an amorphous silicon layer, comprising:
    irradiating with a laser through a first transmission region of a mask, such that a plurality of first crystalline regions is formed in the amorphous silicon layer, wherein each of the first crystalline regions has a first protrusion region;
    irradiating with the laser through a second transmission region of the mask, such that a plurality of second crystalline regions is formed on the non-crystalline regions between the first crystalline regions, wherein each of the second crystalline regions has a second protrusion region; and
    irradiating with the laser through a third transmission region of the mask, such that the first protrusion regions and the second protrusion regions are flattened.

12. The method for crystallizing the amorphous silicon layer as claimed in claim 11, wherein the width of the third transmission regions is less than that of the first transmission regions, and is less than that of the second transmission regions.

13. A method for crystallizing an amorphous silicon layer, comprising:
    irradiating with a laser through a first transmission region of a mask, such that a plurality of odd-numbered first irradiated regions and a plurality of even-numbered first irradiated regions are formed in the amorphous silicon layer;
    irradiating with the laser through a second transmission region of the mask, such that a plurality of first crystalline regions is formed on the odd-numbered/even-numbered first irradiated regions and in the amorphous silicon layer there-around, wherein each of the first crystalline regions has a first protrusion region;
    irradiating with the laser through a third transmission region of the mask, such that a plurality of second crystalline regions is formed on the non-crystalline region between the first crystalline regions, and on the even-numbered/odd-numbered first irradiated regions, wherein each of the second crystalline regions has a second protrusion region; and
    irradiating with the laser through a fourth transmission region of the mask, such that the first protrusion regions and the second protrusion regions are flattened.

14. The method for crystallizing the amorphous silicon layer as claimed in claim 13, wherein the width of the third transmission regions is less than that of the first transmission regions, and is less than that of the second transmission regions.

15. The method for crystallizing the amorphous silicon layer as claimed in claim 13, wherein the width of the fourth transmission regions is less than that of the first transmission regions, and is less than that of the second transmission regions.

16. A mask, suitable for laser-crystallizing amorphous silicon into polysilicon, comprising:
    a transparent substrate, including a first block, a second block, a third block, and a fourth block being arranged adjacently and having the same size, wherein:
    the first block includes a plurality of first transmission regions and a plurality of first opaque regions located between the first transmission regions;
    the second block includes a plurality of second transmission regions, a plurality of third transmission regions, and a plurality of second opaque regions, wherein each of the second transmission regions is located between two adjacent third transmission regions; the second opaque region is located between the adjacent second transmission region and third transmission region; the second transmission regions are arranged such that the positions of the first transmission regions are substantially at the centers of the second transmission regions; and the third transmission regions are arranged corresponding to the first opaque regions;

the third block include a plurality of fourth transmission regions, a plurality of fifth transmission regions, and a plurality of third opaque regions, wherein each of the fourth transmission regions is located between two adjacent fifth transmission regions; the third opaque region is located between the adjacent fourth transmission region and fifth transmission region; the fourth transmission regions are arranged such that the positions of the third transmission regions are substantially at the centers of the fourth transmission regions; and the fifth transmission regions are arranged corresponding to the centers of the second transmission regions; and the fourth block includes a plurality of sixth transmission regions and a plurality of fourth opaque regions, wherein the sixth transmission regions are arranged corresponding to the centers of the fourth transmission regions, and the fourth opaque regions are located between the sixth transmission regions.

17. The mask as claimed in claim 16, wherein the width of the second transmission regions is larger than that of the first transmission regions, and is larger than that of the fifth transmission regions.

18. The mask as claimed in claim 16, wherein the width of the fourth transmission regions is larger than that of the third transmission regions, and is larger than that of the sixth transmission regions.

19. A method for crystallizing an amorphous silicon layer, comprising:

irradiating with a laser through a first transmission region of a mask, such that a plurality of first irradiated regions is formed in the amorphous silicon layer;

irradiating with the laser through a second transmission region and a third transmission region of the mask, such that a plurality of first crystalline regions is formed in the first irradiated regions and the amorphous silicon layer there-around, and a plurality of second irradiated regions is formed in the amorphous silicon layer between the first irradiated regions, wherein each of the first crystalline regions has a first protrusion region;

irradiating with the laser through a fourth transmission region and a fifth transmission region of the mask, such that a plurality of second crystalline regions is formed on the non-crystalline regions between the first crystalline regions, and on the second irradiated regions, and the first protrusion regions are flattened, wherein each of the second crystalline regions has a second protrusion region; and irradiating with the laser through a sixth transmission region of the mask, such that the second protrusion regions are flattened.

20. The method for crystallizing an amorphous silicon layer as claimed in claim 19, wherein the width of the second transmission regions is larger than that of the first transmission regions, and is larger than that of the fifth transmission regions.

21. The method for crystallizing an amorphous silicon layer as claimed in claim 19, wherein the width of the fourth transmission regions is larger than that of the third transmission regions, and is larger than that of the sixth transmission regions.

22. A method for crystallizing amorphous silicon, comprising:

providing a substrate, wherein the substrate is formed with an amorphous silicon layer thereon and is divided into several rows, and each row is divided into a plurality of regions;

aligning and disposing a mask on the first to fourth regions in the first row of the substrate, wherein the mask includes at least four blocks being adjacent to each other and having the same size;

enabling the laser to pass through a plurality of transmission regions of the blocks of the mask, and moving the substrate and/or the mask, such that a relative position between the mask and the substrate is shifted by a distance of one block in a first direction, thereby the laser passes through the transmission regions, and then repeating this step, such that each region in the first row of the substrate aligned with the mask has the laser passing through to form a first crystalline region, and the protrusion region in the first crystalline region is flattened;

moving the substrate and/or the mask, such that the mask is aligned with the last four regions in the second row of the substrate;

enabling the laser to pass through the transmission regions of the blocks of the mask, and moving the substrate and/or the mask, such that a relative position between the mask and the substrate is shifted by a distance of one block in a direction opposite to the first direction, making the laser pass through the transmission regions, and then repeating this step, such that each region in the second row of the substrate aligned with the mask has the laser passing through to form a second crystalline region, and the protrusion region in the second crystalline region is flattened; and repeating the above steps, such that a crystalline region is formed on each region in each row of the substrate, and the protrusion region in the first crystalline region is flattened.

23. A method for crystallizing amorphous silicon, comprising:

providing a substrate, with an amorphous silicon layer formed thereon;

aligning and disposing a first mask above the substrate, wherein the first mask includes a first block and a second block being adjacent to each other and having the same size, wherein:

the first block includes a plurality of first transmission regions and a plurality of first opaque regions located between the first transmission regions; and the second block includes a plurality of second transmission regions being arranged such that the positions of the first opaque regions are substantially at the centers of the second transmission regions, and a plurality of second opaque regions located between the second transmission regions and arranged corresponding to the centers of the first transmission regions;

enabling the laser to pass through the first transmission regions of the first block with the first mask as a mask, so as to form a plurality of first crystalline regions in the amorphous silicon layer, wherein each of the first crystalline regions has a first protrusion region;

moving the substrate and/or the first mask by a distance, such that the second block of the first mask is shifted to a position above the substrate to which the first block previously corresponded, and making the laser pass through the second transmission regions of the second block, such that a plurality of second crystalline regions is formed on a plurality of non-crystalline regions between the first crystalline regions, wherein each of the second crystalline regions has a second protrusion region;

removing the first mask;

disposing a second mask on the substrate, wherein the second mask includes a plurality of third transmission regions corresponding to the centers of the first transmission regions and corresponding to the centers of the second transmission regions, and a plurality of third opaque regions located between the third transmission regions; and aligning the third transmission regions of the second mask with the first protrusion regions and the second protrusion regions, making the laser pass through the third transmission regions, such that the first protrusion regions and the second protrusion regions are flattened.

24. The method for crystallizing amorphous silicon as claimed in claim 23, wherein the substrate is disposed on a base and moved via the base, and the moving distance of the base is no larger than a half of the length of the first mask.

25. The method for crystallizing amorphous silicon as claimed in claim 23, wherein the width of the first transmission regions is larger than that of the second opaque regions, and the width of the second transmission regions is larger than that of the first opaque regions.

26. The method for crystallizing amorphous silicon as claimed in claim 25, wherein the widths of the first transmission regions and that of the second transmission regions are larger than that of the third transmission regions.

27. A method for crystallizing amorphous silicon, comprising:

step A. providing a substrate, wherein the substrate has already been formed with an amorphous silicon layer; the substrate is divided into several rows; and each row includes a first region, a second region, etc. . . . up to an $n^{th}$ region, which are sequentially adjacent;

step B. aligning and disposing a first mask on the first region and the second region in the first row of the substrate, wherein the first mask includes a first block and a second block being adjacent to each other and having the same size, wherein:

the first block includes a plurality of first transmission regions and a plurality of first opaque regions located between the first transmission regions; and the second block includes a plurality of second transmission regions and a plurality of second opaque regions, wherein the second opaque regions are located between the first transmission regions; the width of the second opaque regions is less than that of the second transmission regions; the second opaque regions are arranged corresponding to the center regions of the first transmission regions; and the second transmission regions are arranged such that the positions of the first opaque regions are substantially at the centers of the second transmission regions;

step C. enabling the laser to pass through the second transmission regions and the first transmission regions with the first mask as a mask, so as to form a plurality of first crystalline regions on the first region and the second region in the first row of the substrate, wherein each of the first crystalline regions has a protrusion region respectively;

step D. moving the substrate and/or the first mask for a first distance, such that the second block of the first mask is shifted to a position above the second region in the first row of the substrate where the first block is located previously, and making a laser pass through the first transmission regions and the second transmission regions, wherein with the laser passing through the second transmission regions, a plurality of second crystalline regions is formed on a plurality of non-crystalline regions between the first crystalline regions of the second region of the substrate; and with the laser passing through the first transmission regions, a plurality of first crystalline regions is formed on the third region of the substrate, and each of the first crystalline regions of the third region and each of the second crystalline regions of the second region have a protrusion region respectively;

step E. repeating the above step D, such that a plurality of first crystalline regions and a plurality of second crystalline regions are formed on each region in the first row of the substrate;

step F. removing the first mask;

step G. disposing a second mask above the substrate, wherein the third block includes a plurality of third transmission regions corresponding to the centers of the first transmission regions and corresponding to the centers of the second transmission regions, and a plurality of third opaque regions located between the third transmission regions;

step H. aligning the third transmission regions of the second mask with the protrusion regions of the first crystalline regions and the second crystalline regions of the first region and the second region in the first row of the substrate, and making the laser pass through the third transmission regions, such that the protrusion regions of the first region and the second region are flattened;

step I. moving the substrate and/or the second mask for a second distance, such that the third transmission regions of the second mask corresponds to the third region and the fourth region in the first row of the substrate; and making the laser pass through the third transmission regions; such that the protrusion regions of the third region and the fourth region are flattened; and step J. repeating the step of moving the substrate and/or the second mask for a second distance and making the laser pass through the third transmission regions, such that the protrusion regions of each region in the first row of the substrate are flattened.

28. The method for crystallizing amorphous silicon as claimed in claim 27, wherein in step D, the substrate is disposed on a base and moved via the base, and the moving distance of the base is no larger than a half of the length of the first mask.

29. The method for crystallizing amorphous silicon as claimed in claim 27, wherein the width of the first transmission regions is larger than that of the second opaque regions; and the width of the second transmission regions is larger than that of the first opaque regions.

30. The method for crystallizing amorphous silicon as claimed in claim 29, wherein the widths of the first transmission regions and that of the second transmission regions are larger than that of the third transmission regions.

31. The method for crystallizing amorphous silicon as claimed in claim 27, wherein after step E and before step F, it further comprises:

repeating the above steps of steps C to D, such that a plurality of first crystalline regions and a plurality of second crystalline regions are formed on each region in each row of the substrate; and after step J, it further comprises:

repeating the above steps of steps I to J, such that the protrusion regions of each region in each row of the substrate are flattened.

32. The method for crystallizing amorphous silicon as claimed in claim 27, wherein after step E and before step F, it further comprises:

step K. making the laser pass through the first transmission regions and the second transmission regions with the first mask as a mask, so as to form a plurality of first crystalline regions on the $(n-1)^{th}$ region and the $n^{th}$ region in the second row of the substrate respectively, wherein each of the first crystalline regions has a protrusion region respectively;

step L. moving the substrate and/or the first mask for the first distance, such that the first block of the first mask is shifted to the $(n-1)^{th}$ region in the second row to which the first block previously corresponded and the second block of the first mask is shifted to the $(n-2)^{th}$ region of the substrate, and then making a laser pass through the first transmission regions and the second transmission regions, wherein with the laser passing through the first transmission regions, a plurality of second crystalline regions is formed on a plurality of non-crystalline regions between the first crystalline regions of the $(n-1)^{th}$ region of the substrate; and with the laser passing through the first transmission regions, a plurality of first crystalline regions is formed on the $(n-2)^{th}$ region of the substrate; and each of the first crystalline regions of the $(n-2)^{th}$ region and each of the second crystalline regions of the $(n-1)^{th}$ region has a protrusion region respectively;

step M. repeating the above Step D, such that a plurality of first crystalline regions and a plurality of second crystalline regions are formed on each region in the second row of the substrate; and step N. with the above method of forming the first crystalline regions and the second crystalline regions on each region in the first row of the substrate, forming a plurality of first crystalline regions and a plurality of second crystalline regions on each region of the odd-numbered rows of the substrate; and with the above method of forming the first crystalline regions and the second crystalline regions on each region in the second row of the substrate, forming a plurality of first crystalline regions and a plurality of second crystalline regions on each region of the even-numbered rows of the substrate; and after step J, it further comprises:

using the laser with the second mask as a mask, such that the protrusion regions of each region in each row of the substrate are flattened.

33. The method for crystallizing amorphous silicon as claimed in claim 32, wherein the method of using the laser with the second mask as a mask such that the protrusion regions of each region in each row of the substrate are flattened is to repeat the above steps of steps I to J.

34. The method for crystallizing amorphous silicon as claimed in claim 32, wherein the method of using the laser with the second mask as a mask such that the protrusion regions of each region in each row of the substrate are flattened comprises:

step O. aligning the third transmission regions of the second mask with the protrusion regions of the first crystalline regions and the second crystalline regions of the $(n-1)^{th}$ region and the $n^{th}$ region in the second row of the substrate, and then making the laser pass through the third transmission regions, such that the protrusion regions of the $n^{th}$ region and the $(n-1)^{th}$ region are flattened;

step P. moving the substrate and/or the second mask for the second distance, such that the second mask corresponds to the $(n-3)^{th}$ region and the $(n-2)^{th}$ region in the second row of the substrate, and then making the laser pass through the third transmission regions, such that the protrusion regions of the $(n-3)^{th}$ region and the $(n-2)^{th}$ region are flattened;

step Q. repeating the step of moving the substrate and/or the second mask for a second distance and making the laser pass through the third transmission regions, such that the protrusion regions of each region in the second row of the substrate are flattened; and step R. with the above method of making the protrusion regions of each region in the first row of the substrate be flattened, making the protrusion regions on each region in the odd-numbered rows of the substrate be flattened; and with the above method for making the protrusion regions of each region in the second row of the substrate be flattened, making the protrusion regions on each region in the even-numbered rows of the substrate be flattened.

35. A method for crystallizing an amorphous silicon layer, comprising:

irradiating with a laser through a first transmission region of a first mask, such that a plurality of first crystalline regions is formed in the amorphous silicon layer, wherein each of the first crystalline regions has a first protrusion region;

irradiating with the laser through a second transmission region of the first mask, such that a plurality of second crystalline regions is formed in the non-crystalline regions between the first crystalline regions, wherein each of the second crystalline regions has a second protrusion region; and irradiating with the laser through a third transmission region of a second mask, such that the first protrusion regions and the second protrusion regions are flattened.

36. The method for crystallizing an amorphous silicon layer as claimed in claim 35, wherein the width of the third transmission regions is less than that of the first transmission regions, and less than that of the second transmission regions.

* * * * *